United States Patent [19]
Miyamoto et al.

[11] Patent Number: 5,448,583
[45] Date of Patent: Sep. 5, 1995

[54] APPARATUS AND METHOD USING ANALOG VITERBI DECODING TECHNIQUES

[75] Inventors: Bun-ichi Miyamoto, Sagamihara; Atsushi Yamashita, Kawasaki; Tadashi Nakamura, Nagaokakyo, all of Japan

[73] Assignee: Fujitsu Limited, Kawasaki, Japan

[21] Appl. No.: 355,341

[22] Filed: Dec. 12, 1994

Related U.S. Application Data

[63] Continuation of Ser. No. 225,086, Apr. 8, 1994, abandoned, which is a continuation of Ser. No. 674,348, Apr. 26, 1991, abandoned.

[30] Foreign Application Priority Data

Aug. 28, 1989 [JP] Japan .................. 1-218613
Sep. 6, 1989 [JP] Japan .................. 1-229392

[51] Int. Cl.⁶ .................. G06F 11/10; H03M 13/12
[52] U.S. Cl. .................. 371/43
[58] Field of Search .................. 371/43, 44, 45, 46

[56] References Cited

U.S. PATENT DOCUMENTS

| | | | |
|---|---|---|---|
| 4,087,787 | 5/1978 | Acampora | 371/43 |
| 4,130,818 | 12/1978 | Snyder | 371/43 |
| 4,240,156 | 12/1980 | Doland | 371/43 |
| 4,427,903 | 1/1984 | Sugimoto | 307/355 |
| 4,545,054 | 10/1985 | Davis | 371/43 |
| 4,547,741 | 10/1985 | Katakura | 330/149 |
| 4,606,027 | 8/1986 | Otani | 371/43 |
| 4,614,933 | 9/1986 | Yamashita et al. | 341/51 |
| 4,685,048 | 8/1987 | Tazaki | 363/127 |
| 4,763,328 | 8/1988 | Shimoda et al. | 371/3 |
| 4,804,904 | 2/1989 | Katakura | 323/312 |
| 4,823,346 | 4/1989 | Kobayashi | 371/43 |
| 4,905,317 | 2/1990 | Suzuki | 371/43 |
| 5,027,374 | 6/1991 | Rossman | 371/43 X |
| 5,150,369 | 9/1992 | Costa | 371/43 |

FOREIGN PATENT DOCUMENTS

| | | | |
|---|---|---|---|
| 0316999 | 5/1989 | European Pat. Off. | |
| 256964 | 6/1988 | Germany | |
| 57-046161 | 3/1982 | Japan | |
| 59-163909 | 9/1984 | Japan | |
| 60-024712 | 2/1985 | Japan | |
| 60-187262 | 9/1985 | Japan | |
| 0176333 | 10/1985 | Japan | 371/43 |
| 61-045314 | 3/1986 | Japan | |
| 62-155604 | 7/1987 | Japan | |
| 63-275227 | 11/1988 | Japan | |
| 63-309014 | 12/1988 | Japan | |

Primary Examiner—Robert W. Beausoliel, Jr.
Assistant Examiner—Glenn Snyder
Attorney, Agent, or Firm—Staas & Halsey

[57] ABSTRACT

An analog Viterbi decoder realizes a part of the signal processing operations necessary to produce a decoded signal by, for example, calculation of branch metrics in branch metric calculation circuit, and addition, comparison, and selection an ACS circuit, using analog signal processes, to remarkably decrease the number of elements, and to realize a high speed Viterbi decoder with a relatively small size.

14 Claims, 36 Drawing Sheets

Fig. 35

$$\text{SEL00} = \overline{S00} \cdot \overline{S01} \cdot \overline{S02} \oplus \overline{S10} \cdot \overline{S21} \cdot S02$$

$$\text{SEL01} = \overline{S20} \cdot \overline{S01} \cdot \overline{S02} \oplus \overline{S30} \cdot \overline{S21} \cdot S02$$

$$\text{SEL02} = S00 \cdot \overline{S01} \cdot \overline{S02} \oplus S10 \cdot \overline{S21} \cdot S02$$

$$\text{SEL03} = S20 \cdot \overline{S01} \cdot \overline{S02} \oplus S30 \cdot \overline{S21} \cdot S02$$

$$\text{SEL10} = \overline{S00} \cdot \overline{S01} \cdot \overline{S12} \oplus \overline{S10} \cdot \overline{S21} \cdot S12$$

$$\text{SEL11} = \overline{S20} \cdot \overline{S01} \cdot \overline{S12} \oplus \overline{S30} \cdot \overline{S21} \cdot S12$$

$$\text{SEL12} = S00 \cdot \overline{S01} \cdot \overline{S12} \oplus S10 \cdot \overline{S21} \cdot S12$$

$$\text{SEL13} = S20 \cdot \overline{S01} \cdot \overline{S12} \oplus S30 \cdot \overline{S21} \cdot S12$$

$$\text{SEL20} = \overline{S00} \cdot \overline{S11} \cdot \overline{S22} \oplus \overline{S10} \cdot \overline{S31} \cdot S22$$

$$\text{SEL21} = \overline{S20} \cdot \overline{S11} \cdot \overline{S22} \oplus \overline{S30} \cdot \overline{S31} \cdot S22$$

$$\text{SEL22} = S00 \cdot \overline{S11} \cdot \overline{S22} \oplus S10 \cdot \overline{S31} \cdot S22$$

$$\text{SEL23} = S20 \cdot \overline{S11} \cdot \overline{S22} \oplus S30 \cdot \overline{S31} \cdot S22$$

$$\text{SEL30} = \overline{S00} \cdot \overline{S11} \cdot \overline{S32} \oplus \overline{S10} \cdot \overline{S31} \cdot S32$$

$$\text{SEL31} = \overline{S20} \cdot \overline{S11} \cdot \overline{S32} \oplus \overline{S30} \cdot \overline{S31} \cdot S32$$

$$\text{SEL32} = S00 \cdot \overline{S11} \cdot \overline{S32} \oplus S10 \cdot \overline{S31} \cdot S32$$

$$\text{SEL33} = S20 \cdot \overline{S11} \cdot \overline{S32} \oplus S30 \cdot \overline{S31} \cdot S32$$

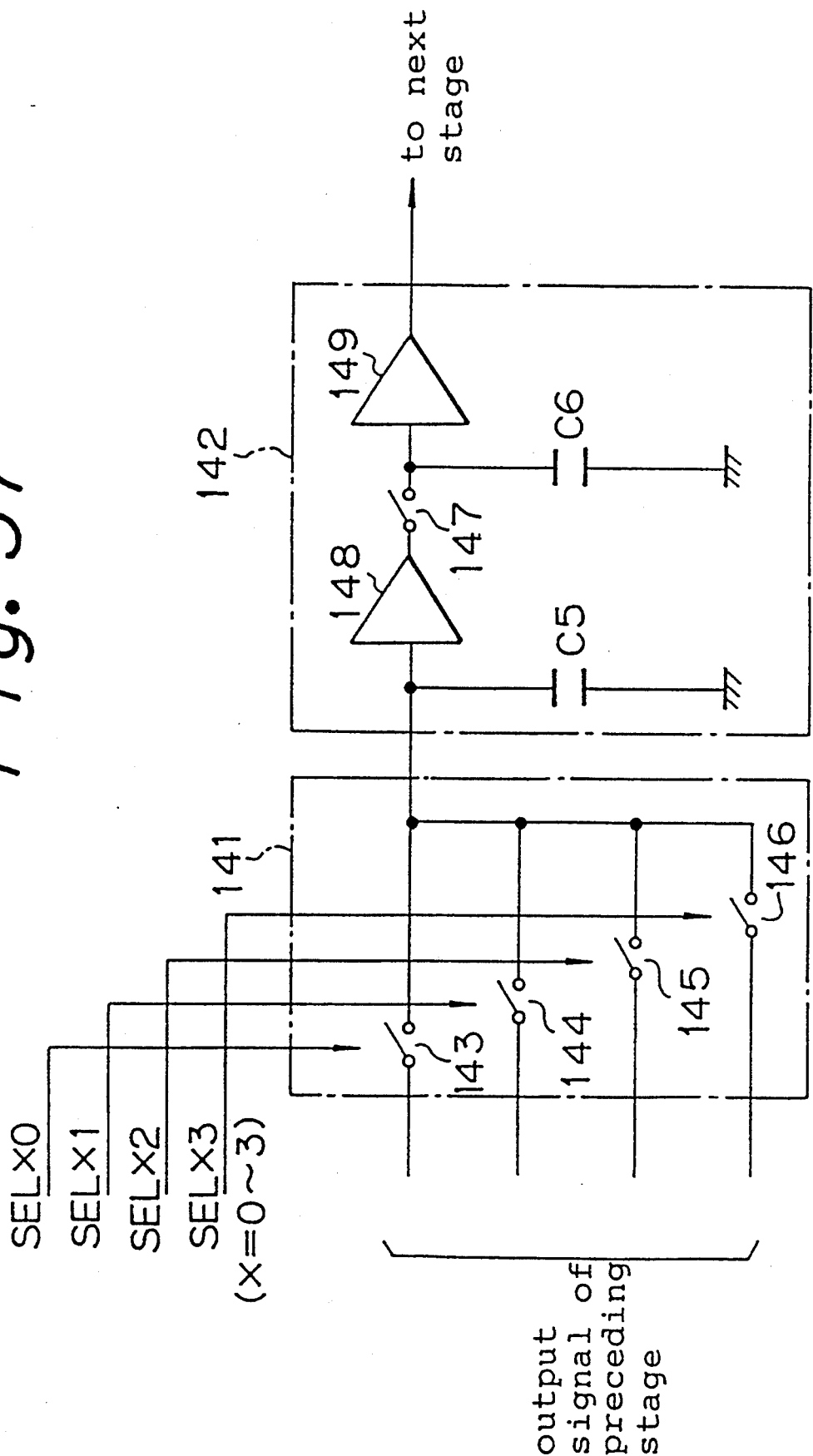

APPARATUS AND METHOD USING ANALOG VITERBI DECODING TECHNIQUES

This application is a continuation, of application Ser. No. 08/225,086, filed Apr. 8,1994, now abandoned, which is a continuation, of application Ser. No. 07/674,348, filed Apr. 26, 1991, now abandoned.

BACKGROUND OF THE INVENTION

1. Field of the Invention

The present invention relates to a Viterbi decoder for performing maximum likelihood decoding of convolutional codes using a Viterbi algorithm. More particularly, the present invention relates to an analog Viterbi decoder wherein at least a part of the aforementioned decoding process is carried out in an analog signal process.

2. Description of Related Art

A Viterbi decoder efficiently searches a plurality of known code sequences using a Viterbi algorithm to find a path of a code sequence which is at the shortest code distance from a received code sequence from among the plurality of known code sequences, to output a decoded signal corresponding to the path found. The Viterbi decoders are, for example, used for error correction in satellite communication systems, since the decoder has great error correction capability.

Conventionally, the Viterbi decoders have been realized only by digital signal processing, as described, for example, in U.S. Pat. Nos. 4,614,933 and 4,763,328.

Increasing the constraint length K of a convolutional code improves the error correction capability of the Viterbi decoder. However, increasing the constraint length exponentially increases the physical size of the decoder. A large scale integrated circuit is usually employed to realize a Viterbi decoder having such a large scale construction. Nevertheless, a decoder using a TTL circuit construction is not easily realized because the circuit scale is not so easily reduced and power consumption is very large in the TTL circuit. On the other hand, the power consumption of a circuit having a CMOS circuit construction is not so large, and therefore, the decoder can be realized by a several-chip construction using CMOS circuits.

The CMOS circuit construction, however, can not be applied when a high speed operation of more than 20 to 30 Mbps is required, since a maximum operation speed of the CMOS circuit is around that level. In this case an ECL circuit construction may be applied. However, the decoder constructed by the ECL circuit cannot be miniaturized because the power consumption of the ECL circuit is greater than that of the TTL circuit. Thus, a high speed Viterbi decoder having greater error correction capability has not been realized in a relatively small size using only digital signal processing.

Soft decision decoding is usually employed in the Viterbi decoder rather than hard decision decoding. In the soft decision decoding, a demodulated base band signal is quantized into a digital value in a plurality of quantization levels and the code distance is estimated in the form of the digital values. In this case, the coding gain of the Viterbi decoder is improved if the number of quantization levels is increased. The number of quantization levels is, however, actually limited, because the complexity of the circuit is increased as the number of quantization levels is increased.

SUMMARY OF THE INVENTION

It is a principal object of the present invention to provide a high speed Viterbi decoder which has greater error correction capability with a simple construction by introducing analog signal processing into at least a part of the decoding process.

It is another object of the present invention to provide a Viterbi decoder which has improved coding gain in soft decision decoding.

In accordance with the present invention there is provided an analog Viterbi decoder comprising branch metric calculation means for successively calculating branch metrics from received symbols to output the branch metrics, ACS means for successively calculating pairs of path metrics by adding preselected pairs of branch metrics and preselected pairs of the last path metrics, respectively, for comparing the pairs of calculated path metrics with each other to select paths having smaller path metric values, and for outputting path selection signals to be used in the selections, and path memory means for successively storing candidates for a decoded signal according to the path selection signals and for successively refining the candidates according to the path selection signals to obtain decoded signal, wherein the branch metric calculation means output the branch metrics in analog signal form, and the ACS means perform said addition, comparison, and selection operations in analog signal processes.

BRIEF DESCRIPTION OF THE DRAWINGS

FIG. 35 is a diagram showing a logic construction of the logic circuit shown in FIG. 34;

FIG. 37 is a circuit diagram showing an example of a circuit construction of the analog path memory cell shown in FIG. 34.

DESCRIPTION OF THE PREFERRED EMBODIMENTS

Before describing the preferred embodiments according to the invention, examples of aforementioned related art are given with reference to the accompanying drawings.

Figure 1:
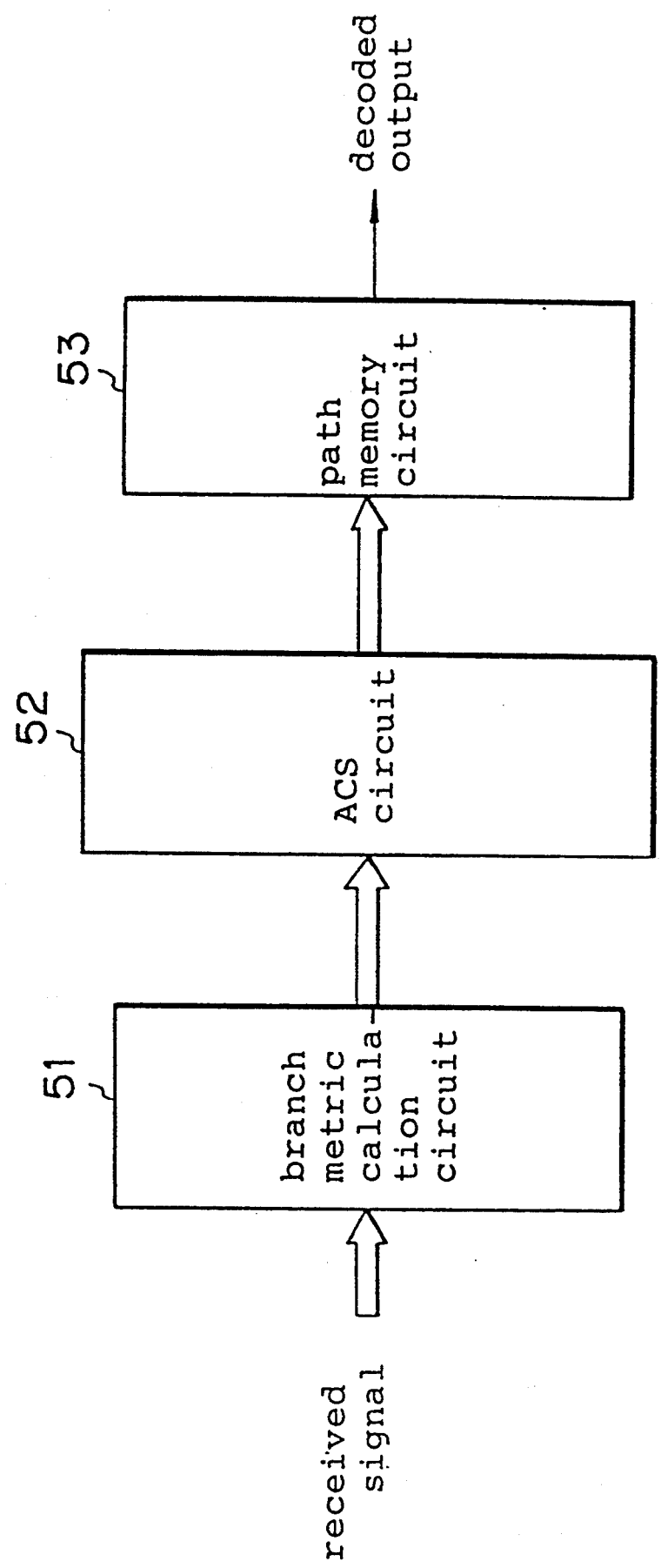
FIG. 1 is a schematic construction diagram of a conventional Viterbi decoder.
Figure 2:
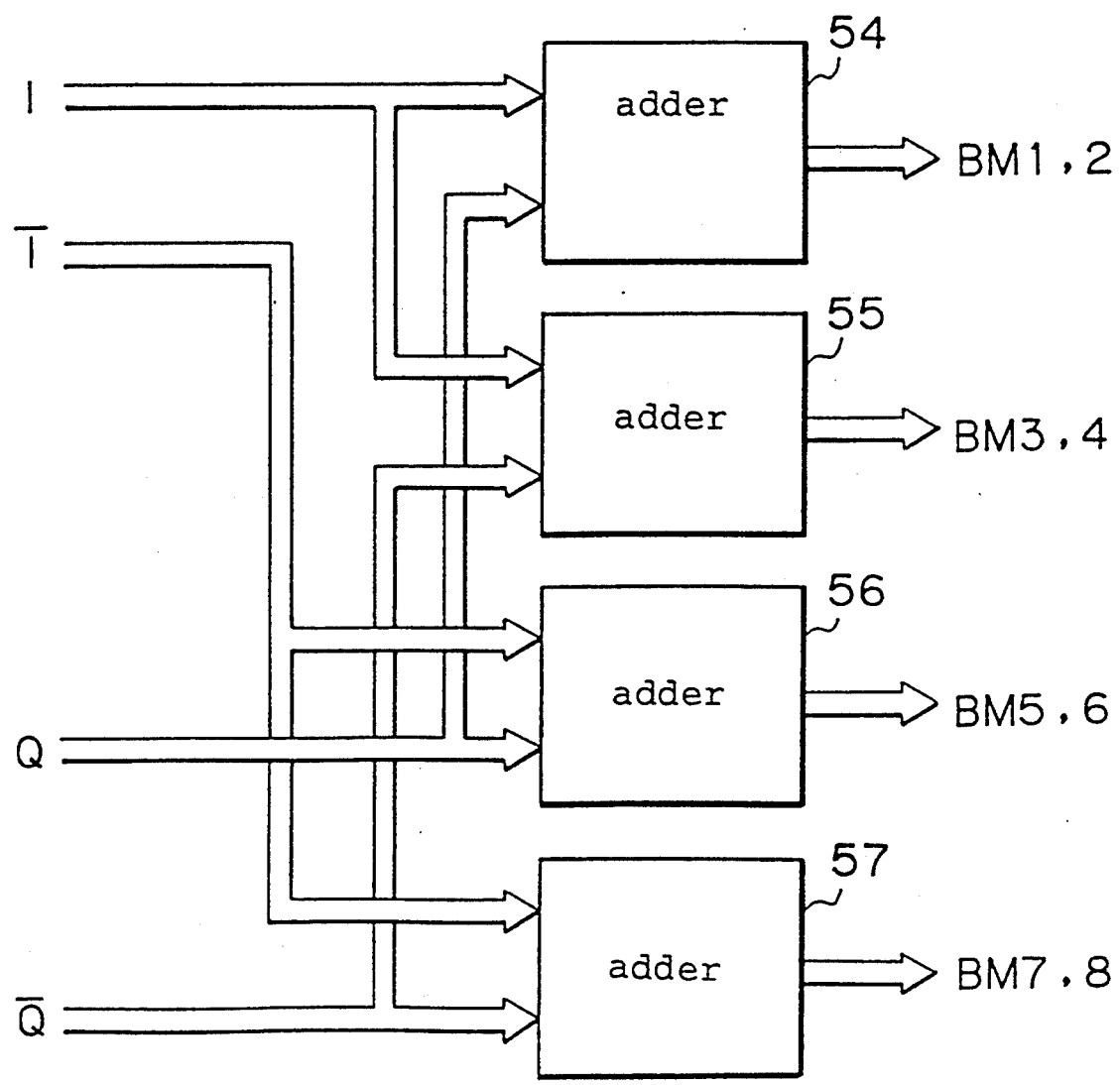
FIG. 2 is a block diagram showing a construction of a conventional branch metric calculation circuit.

FIG. 1 shows a schematic construction of a conventional Viterbi decoder. A branch metric calculation circuit 51 has, for example, a construction as shown in FIG. 2. In the case where the received signal is a quadratic amplitude modulated (QAM) signal and where its demodulated signal is decided in a soft decision of 8 levels, I and Q phase signals represented by 3 bits are supplied to the branch metric calculation circuit 51.

The adders 54 to 57 output four branch metrics BM1 to BM4 represented by 4 bits by calculating (I+Q), (I+$\bar{Q}$), ($\bar{I}$+Q), and ($\bar{I}$+Q), respectively.

Figure 3:
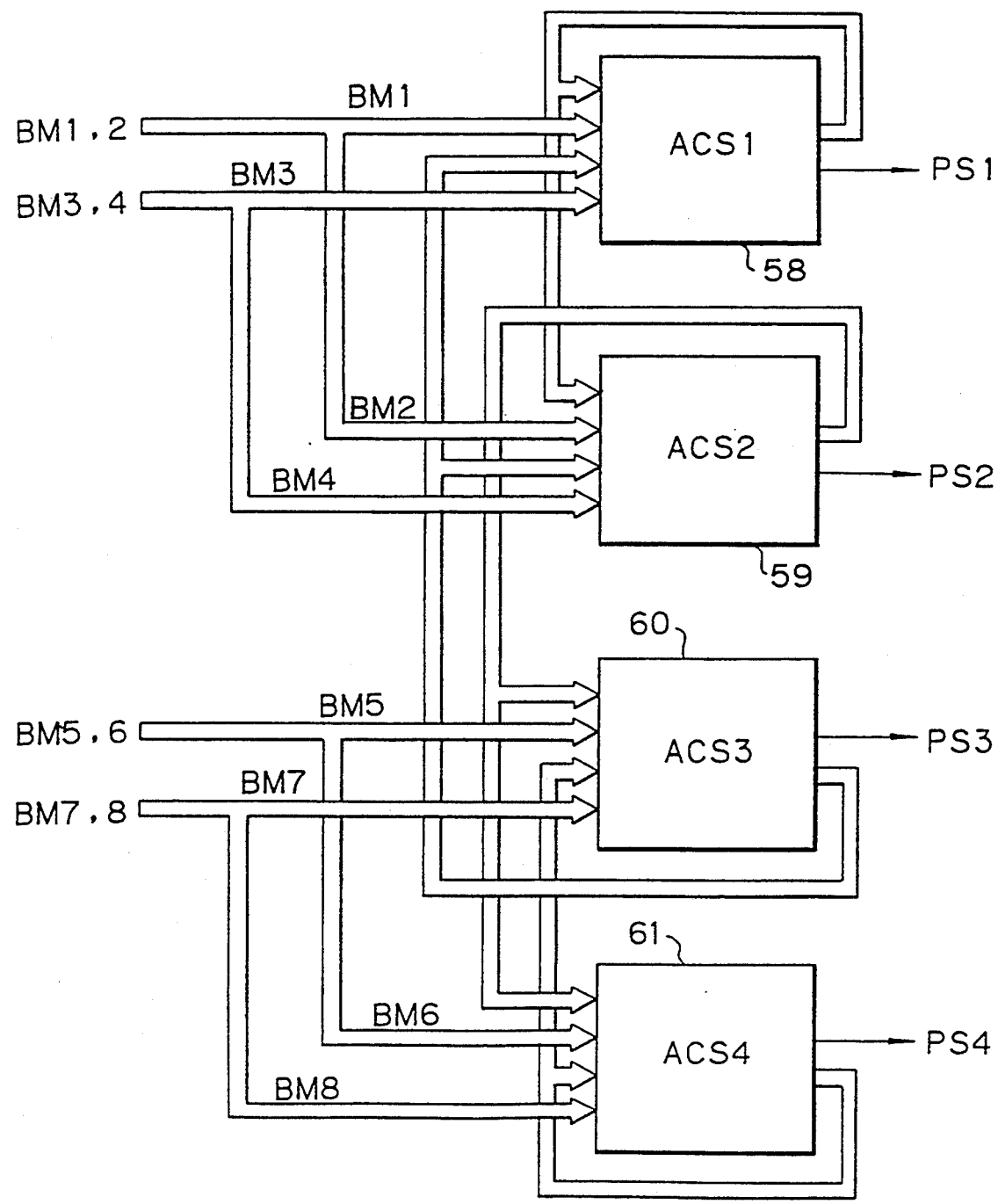
FIG. 3 is a block diagram showing a construction of a conventional ACS circuit.

An ACS circuit 52 (FIG. 1) comprises Adders, Comparators, and Selectors. When the constraint length of a convolutional code is K, the ACS circuit 52 has $2^{K-1}$ ACS circuit blocks. For example, if the constraint length K is 3, the ACS circuit 52 is constructed from four ACS circuit blocks (ACS1 to ACS4) 58 to 61, as shown in FIG. 3. Each ACS circuit block 58 to 61 calculates two path metrics by adding two branch metrics to two last path metrics, respectively, determined by a generator polynomial of the convolutional code, compares the two path metric values with each other, selects a path metric having a smaller value as a retained path metric, and outputs a path select signal PS1 to PS4 having been used for that selection.

Figure 4:
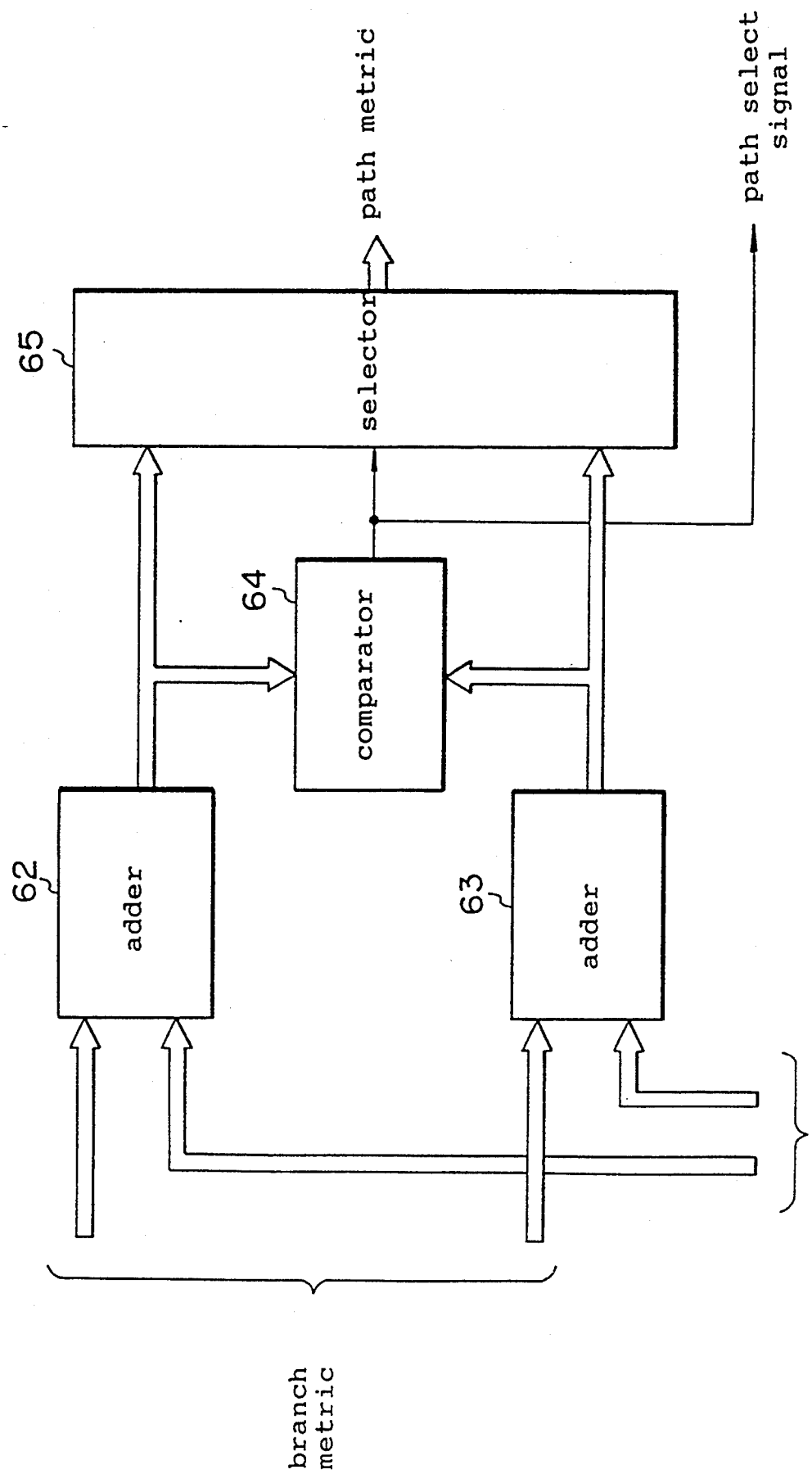
FIG. 4 is a block diagram showing a construction of a conventional ACS circuit units.

Each ACS circuit block 58 to 61 has, for example, a construction as shown in FIG. 4. In the ACS circuit block 58, for example, as shown in FIG. 3, branch metrics BM1 and BM3 are added to the last path metrics PS1' and PS3' from the ACS circuit blocks 58 and 60 in adders 62 and 63, respectively, the path metrics BM1+PS1' from the adder 62 and BM3+PS3' from adder 63 are compared with each other in a comparator 64, a path metric having smaller value is selected as a new path metric in a selector 65, and a path select signal having been used for that selection is output to be supplied to a path memory circuit 53 (FIG. 1).

Figure 5:
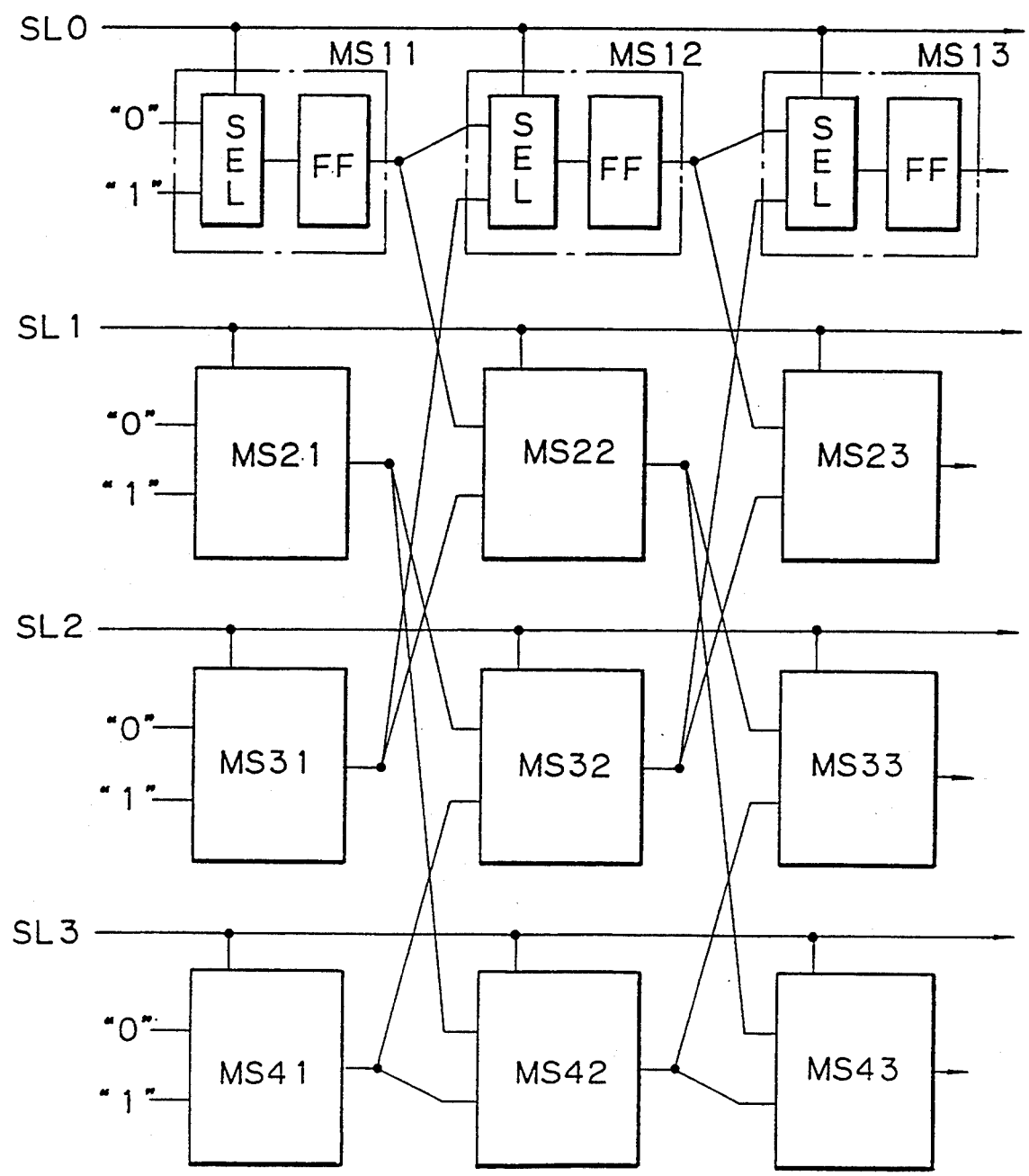
FIG. 5 is a block diagram showing a construction of a conventional path metric memory.

The path memory circuit 53 has, for example, a constructions as shown in FIG. 5, wherein MS11 to MS43 denote path memory cells, SEL denotes a selector, and FF denotes a flip-flop. The path memory circuit 53 comprises $2^{K-1} \times L$ path memories wherein L is a truncation length of a convolutional code and K is the constraint length of the convolutional code. Generally, the value (4 to 5)×K is used for the truncation length L. The first three stages of the path memories wherein K=3 are shown in FIG. 5.

The path select signals SL0 to SL3 are supplied to selectors SEL in the corresponding path memory cells. One of two outputs of two path memory cells of the preceding stage is selected by the path select signal to be stored in the flip-flop FF. Namely, the contents of the path memory cells at selected sides as retained paths are transferred according to the path select signals SL0 to SL3 in each decoding cycle, and a decoded output is obtained by majority decision of the outputs of the final stage.

As previously stated, the ACS circuit 52 requires $2^{K-1}$ ACS circuit blocks and the path memory circuit requires $2^{K-1} \times L$ path memory cells.

Therefore, it is very difficult to realize a high speed Viterbi decoder employing sufficient constraint length and small in size only by digital circuits.

The preferred embodiments of the present invention will now be described with reference to the accompanying drawings.

Figure 6:
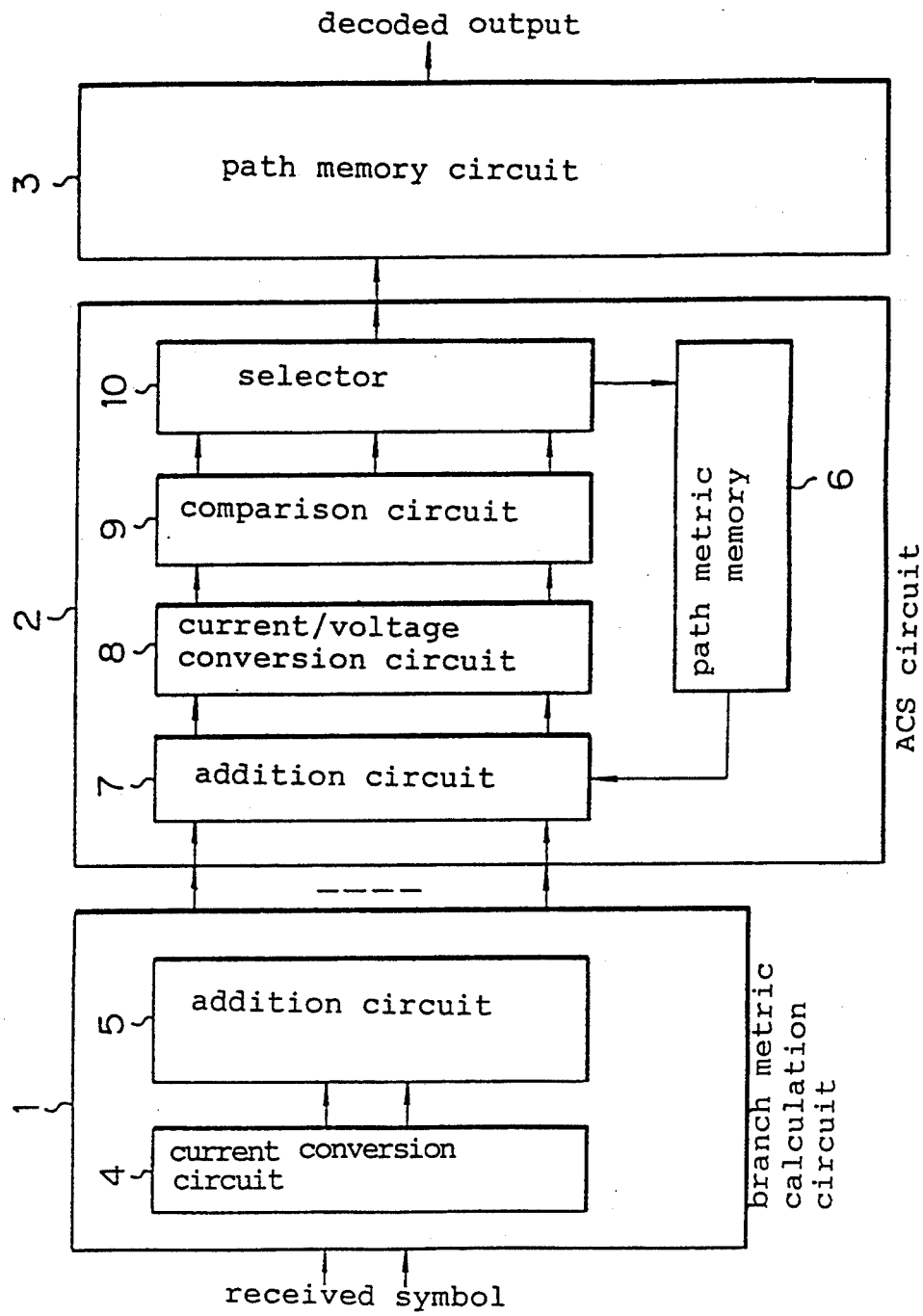
FIG. 6 is a block diagram showing a construction of an analog Viterbi decoder according to the present invention.

FIG. 6 shows a schematic construction of the first embodiment of the present invention.

In a branch metric calculation circuit 1 and an ACS circuit 2, almost all of the operation is carried out in analog signal processing circuits. The analog signal processing can be also applied to a path memory circuit 3.

Figure 7:
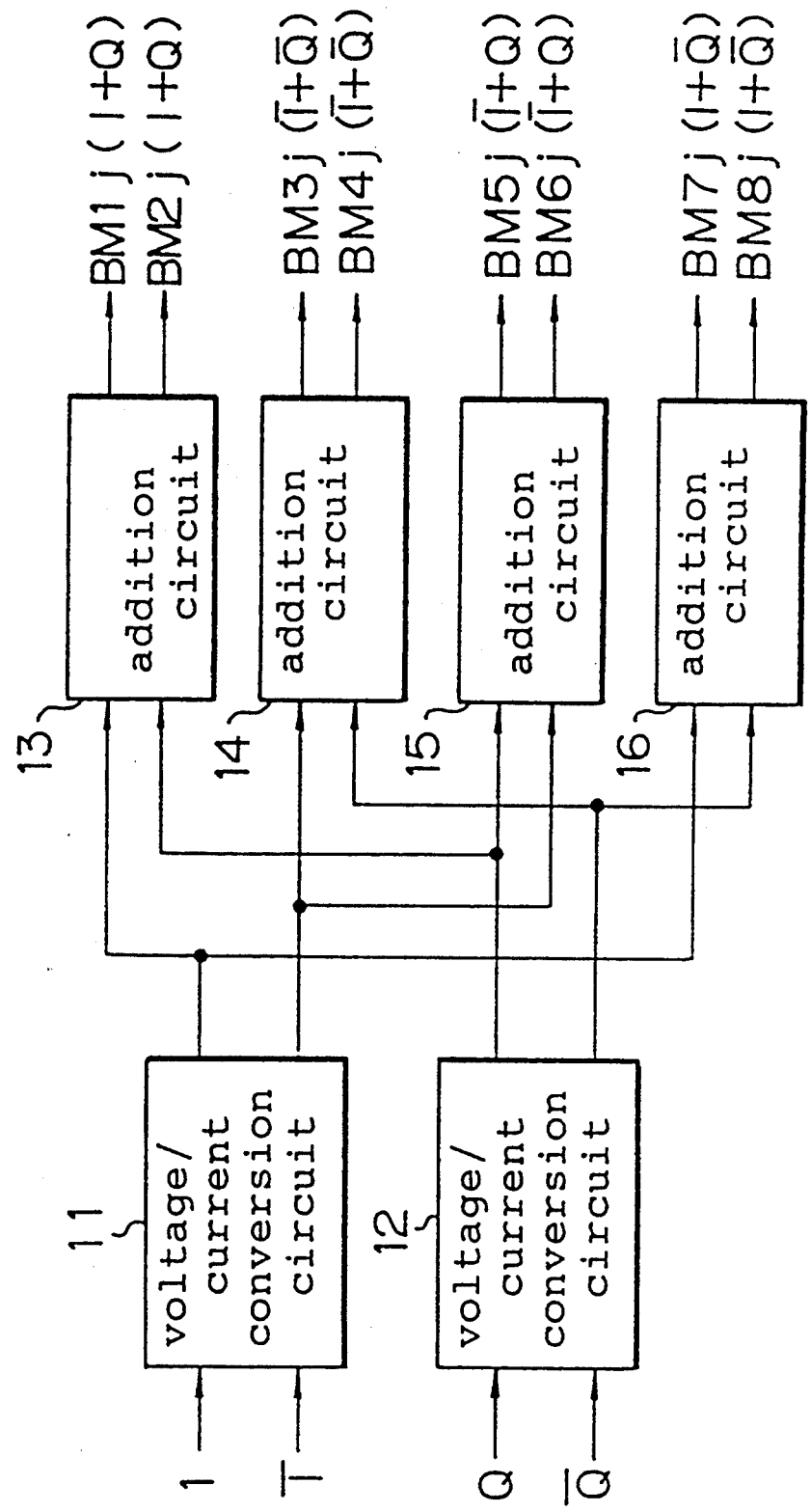
FIG. 7 is a block diagram showing a construction of a first example of a branch metric

FIG. 7 is a block diagram showing a construction of the first example of the branch metric calculation circuit 1 wherein K=3. Voltage values of demodulated signals I, $\bar{I}$, Q, $\bar{Q}$ are transferred to current values in voltage/current transfer circuits 11 and 12. The current signals having been transferred are supplied to addition circuits 13 to 16. The addition circuit 13 outputs current signals BM1$_j$ and BM2$_j$ which correspond to I+Q, the addition circuit 14 outputs current signals BM3$_j$ and BM4$_j$ which correspond to $\bar{I}$+Q, the addition circuit 15 outputs current signals BM5$_j$ and BM6$_j$ which correspond to $\bar{I}$+$\bar{Q}$, and the addition circuit 16 outputs current signals BM7$_j$ and BM8$_j$ which correspond to I+$\bar{Q}$.

Figure 8:
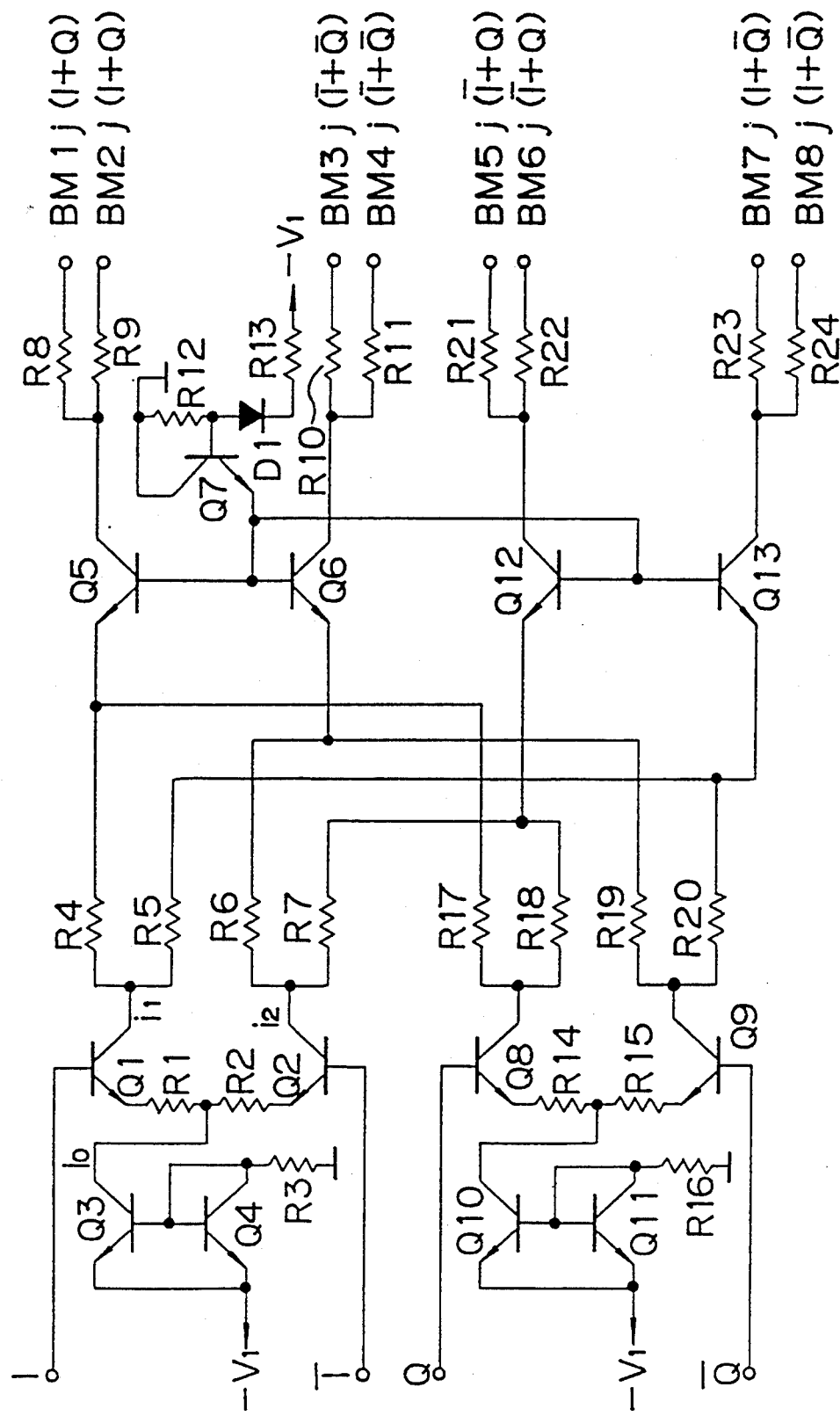
FIG. 8 is a detailed circuit diagram of the branch metric calculation circuit shown in FIG. 7.

FIG. 8 is a circuit diagram of a main part of the branch metric calculation circuit 1. Q1 to Q13 are transistors, R1 to R24 are resistors and D1 is a diode.

Also referring to FIG. 7, the voltage/current transfer (or "conversion") circuit 11 is realized by the transistors Q1 to Q4 and the resistors R1 to R7, the voltage/current transfer (or "conversion") is realized by the transistors Q8 to Q11 and the resistors R14 to R20, the addition circuits 13 and 14 are realized by the transistors Q5 and Q6, and the addition circuits 15 and 16 are realized by the transistors Q12 and Q13.

The transistors Q3 and Q4 and the resistor R3 constitutes a current mirror circuit providing a constant current the value of which is approximately determined by source voltage V$_1$, and a value of R3. A pair of transistors Q1 and Q2 and the constant current circuit constitute a part of a differential amplifier. Since a load resistor of the the differential amplifier is located outside of the circuit, the output signal in response to the difference between input voltages is output in the form of current i$_1$ and i$_2$. The I phase signal I and an inverted I phase signal $\bar{I}$ are input to the differential amplifier (voltage/current converter). Therefore, the current i$_1$ varies proportionally to I and the current i$_2$ varies proportionally to $\bar{I}$. When the voltage values of I and $\bar{I}$ are the same, i$_1$ becomes equal to i$_2$. R1 and R2 are provided in order to stabilize an amplification degree, i.e., a voltage/current conversion ratio, by providing the differential amplifier with negative feedback. The values of R1 and R2 are preferably selected, so that i$_1$ becomes equal to i$_0$, and i$_2$ becomes zero when the I phase input voltage is at a nominal "1" level, and i$_2$ becomes equal to i$_0$, and i$_1$ becomes zero when the $\bar{I}$ is at a nominal "1" level. R4, R5 and R6, R7 are provided in order to equally distribute i$_1$ and i$_2$, respectively, without interfering with each other.

The circuit constituted by Q8 to Q11 and R14 to R20 operates in the same manner as the aforementioned circuit constituted by Q1 to Q4 and R1 to R7. The latter is that for the I phase signal and the former is that for the Q phase signal.

A constant electrical potential is applied to a base terminal of the transistor Q5, so that the transistor operates as a grounded base type amplifier. Since a current proportional to I is supplied to an emitter terminal of Q5 through R4, and a current proportional to Q is supplied through R17, Q5 operates as an adder which outputs a current signal corresponding to I+Q, i.e., branch metric BM1$_j$ or BM2$_j$.

R8 and R9 are resistors for distributing BM1$_j$ and BM2$_j$ without interfering with each other. The j's represent addresses of the ACS circuits in the following stage to be connected, and they are determined by a generator polynomial of the convolutional code.

A circuit constituted by Q6 and two resistors R10 and R11, a circuit constituted by Q12 and two resistors R21 and R22, and a circuit constituted by Q13 and two resistors R23 and R24 operate in the same manner as the circuit constituted by Q5 and two resistors R8 and R9, and output current signals corresponding to $\bar{I}$+Q, $\bar{I}$+$\bar{Q}$, and I+$\bar{Q}$, respectively. An electric potential which is formed by a source voltage-V$_1$, R12, R13, and a diode D1 and whose output impedance is lowered by an emitter follower circuit of Q7, is applied to each base terminals of Q5, Q6, Q12 and Q13. D1 is provided to compensate for temperature characteristics of Q7 for the purpose of reducing the effect of temperature drift of Q7, because voltages between the collector and emitter terminals of Q5, Q6, Q12 and Q13 cannot be sufficiently high to eliminate the effect due to voltage drop by serially inserted resistors.

Operation accuracy is described in the case where the circuit shown in FIG. 8 is implemented by a monolithic IC. In a monolithic bipolar analog IC, though accuracy and temperature dependency of values of resistances are not at all acceptable, i.e., ±20% and +2000 ppm/° C. respectively, relative values thereof can be held to within ±2%. The input signals I, $\bar{I}$, Q, and $\bar{Q}$ are converted into current metrics by the differential amplifier. The total current i$_0$ is approximately determined by R3 or R16. In the circuit of the present invention, since each current metric is determined by relative value of each resistor, the differences between output values are small.

Additionally, since the differential amplifiers Q1, Q2, and Q8, Q9 are provided with sufficient negative feedback by their emitter resistors R1, R2 and R14, R15, respectively, the effect of dispersion of characteristic values of Q1, Q2 and Q8, Q9 can be sufficiently eliminated.

While at least about eighty BC's (basic Cells) are required to constitute an eight-bit adder in a digital circuit, the adder can be realized by a single transistor and two resistors in this embodiment. Even in a Viterbi decoder where K=3, twelve adders are required. Therefore, such simplification can greatly contribute to reduction of circuit scale.

Stabilization of the circuit by the negative feedback by the aforementioned emitter resistors R1, R2 and R14, R15 facilitate high speed operation of the circuit. Also, the adder using the grounded base transistor is advantageous in high speed operation.

Furthermore, if resistors having as low value as the current permits are used, a circuit wherein the transistors operate to their full ability is realized.

Figure 9:
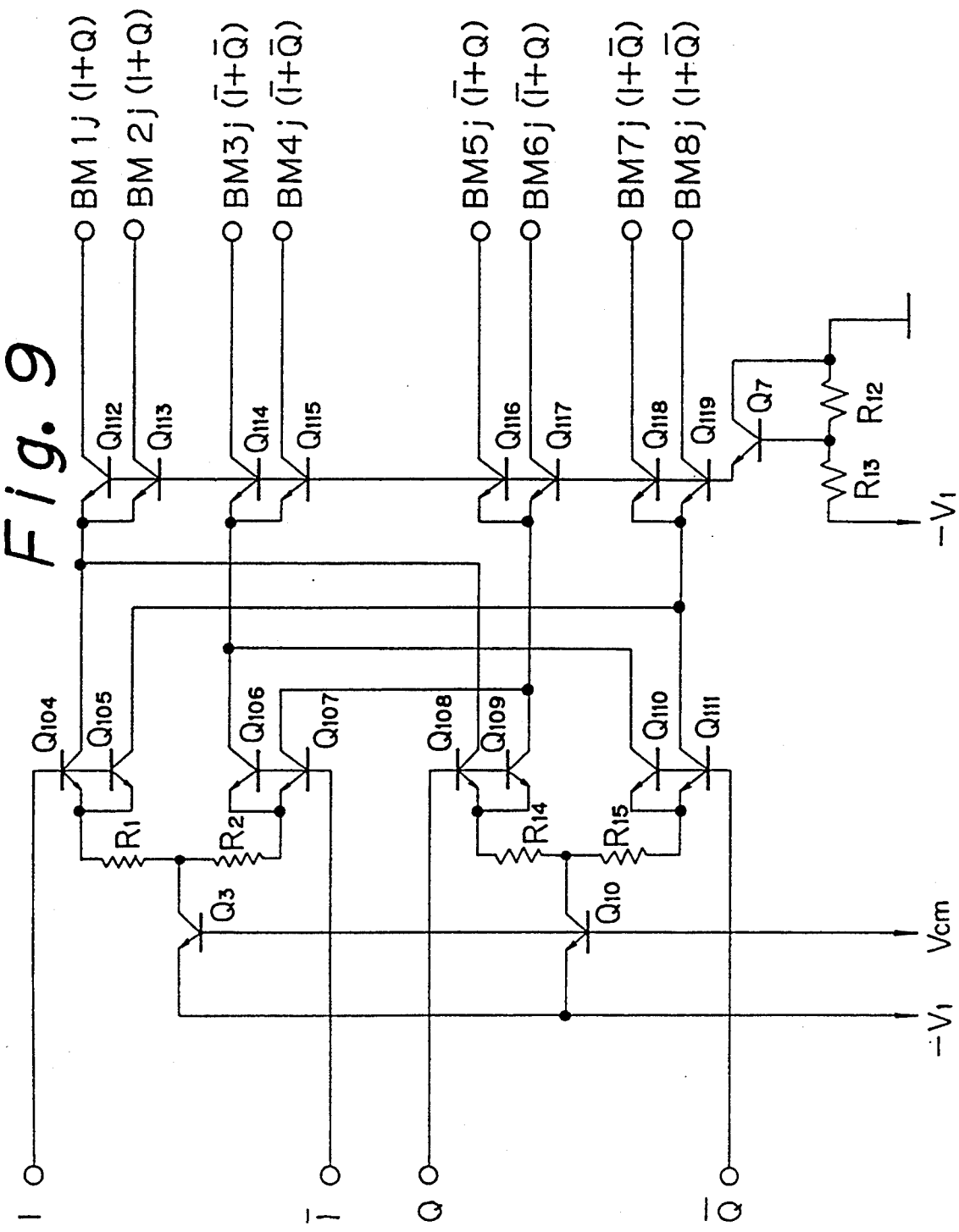
FIG. 9 is a circuit diagram of a modification of the circuit of FIG. 8.

FIG. 9 is a circuit diagram showing an improved circuit of the branch metric calculation circuit shown in FIG. 8. Q4, R3 and Q11, R16 of FIG. 8 are replaced by one side of a common current mirror circuit (not shown, but described later), whose constant voltage output Vcm is applied to base terminals of Q3 and Q10. This construction ensures equal current values in the constant current sources for a pair of the differential amplifiers, so that accuracy of the current metric is further improved Q1 and R4, R5 of FIG. 8 are replaced by two transistors Q104 and Q105. Similarly, Q5, R8, R9 are replaced by Q112, Q113; Q2, R6, R7 are replaced by Q106, Q107; Q6, R10, R11 are replaced by Q114, Q115; Q8, R17, R18 are replaced by Q108, Q109; Q12, R21, R22 are replaced by Q116, Q117; Q9, R19, R20 are replaced by Q110, Q111; and Q13, R23, R24 are replaced by Q118, Q119. These replacements reduce the number of elements and eliminate voltage drop caused by the resistors, so that the potential differences between the collector and emitter of the transistor Q112 to Q119 become of sufficient value to eliminate the need for the diode D1(FIG. 8) to compensate temperature dependency.

Figure 10:
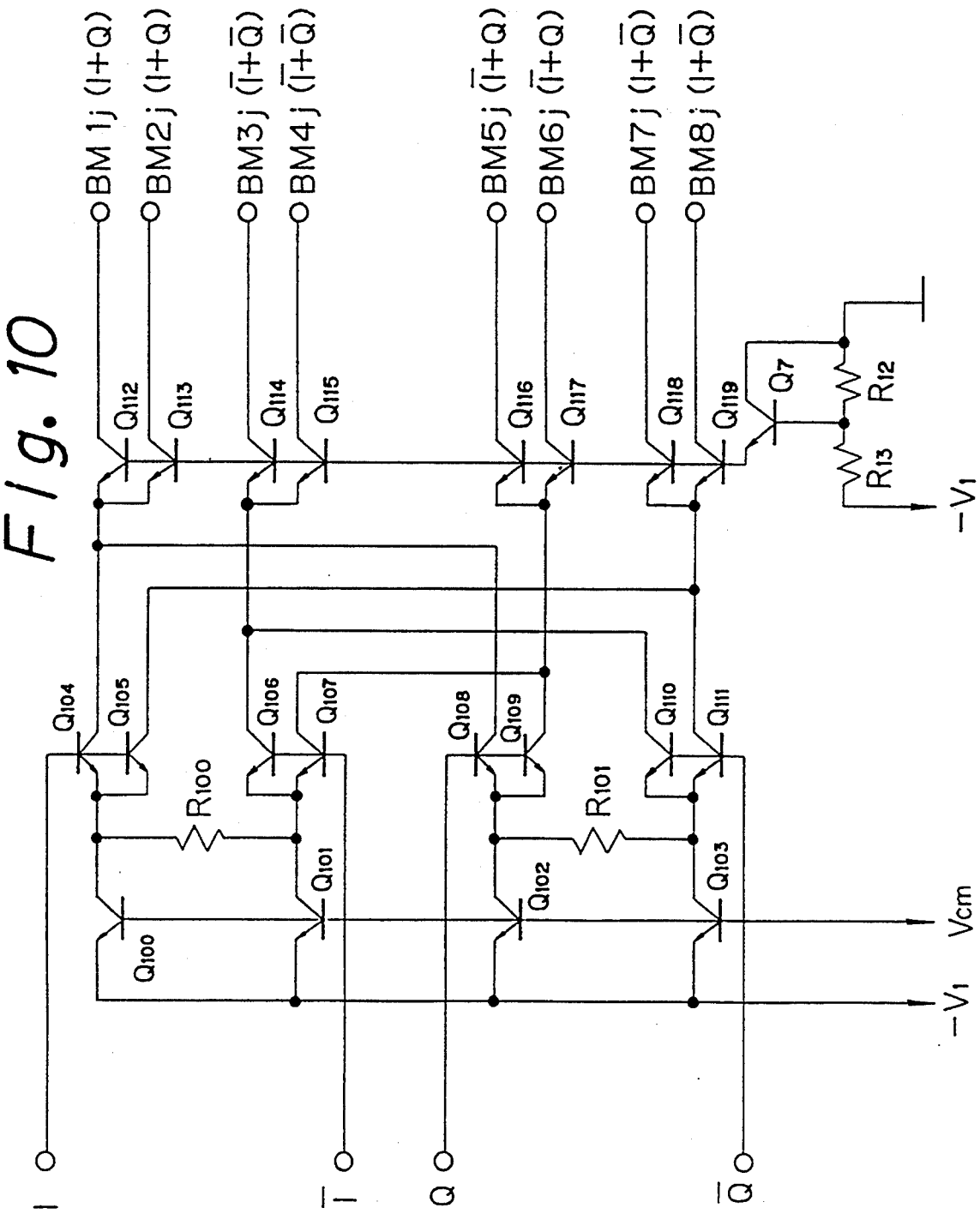
FIG. 10 is a circuit diagram of a modification of the/-circuit of FIG. 9.

FIG. 10 shows a further improved circuit of the circuit shown in FIG. 9.

In this circuit, seesaw differential amplifiers (SSDA's) are employed as the differential amplifiers for voltage/current conversion. In this type of differential amplifier, two transistors (for example, Q100 and Q101) are used as constant current sources for a pair of transistors (for example, Q104 and Q105), respectively, and a single resistor (for example, R100) is provided between emitter terminals of the pair of transistors to provide negative feedback. In the conventional differential amplifier, currents always flow through the emitter resistors (R1, R2 in FIG. 9) and the mean value of the currents is constant so that certain voltage drops always occur due to the mean voltage of the resistors. On the other hand, in this type of differential amplifier, current flows through the resistor in response to the difference between input voltages, and when the input voltages are equal to each other, the current does not flow. Thus, this type of differential amplifier has an advantage of high efficiency in utilization of voltage because there is no fixed voltage drop at the emitter resistor. Additionally, this type of differential amplifier is more advantageous in integration, because the number of resistors is smaller though the total number of elements is the same.

Figure 11:
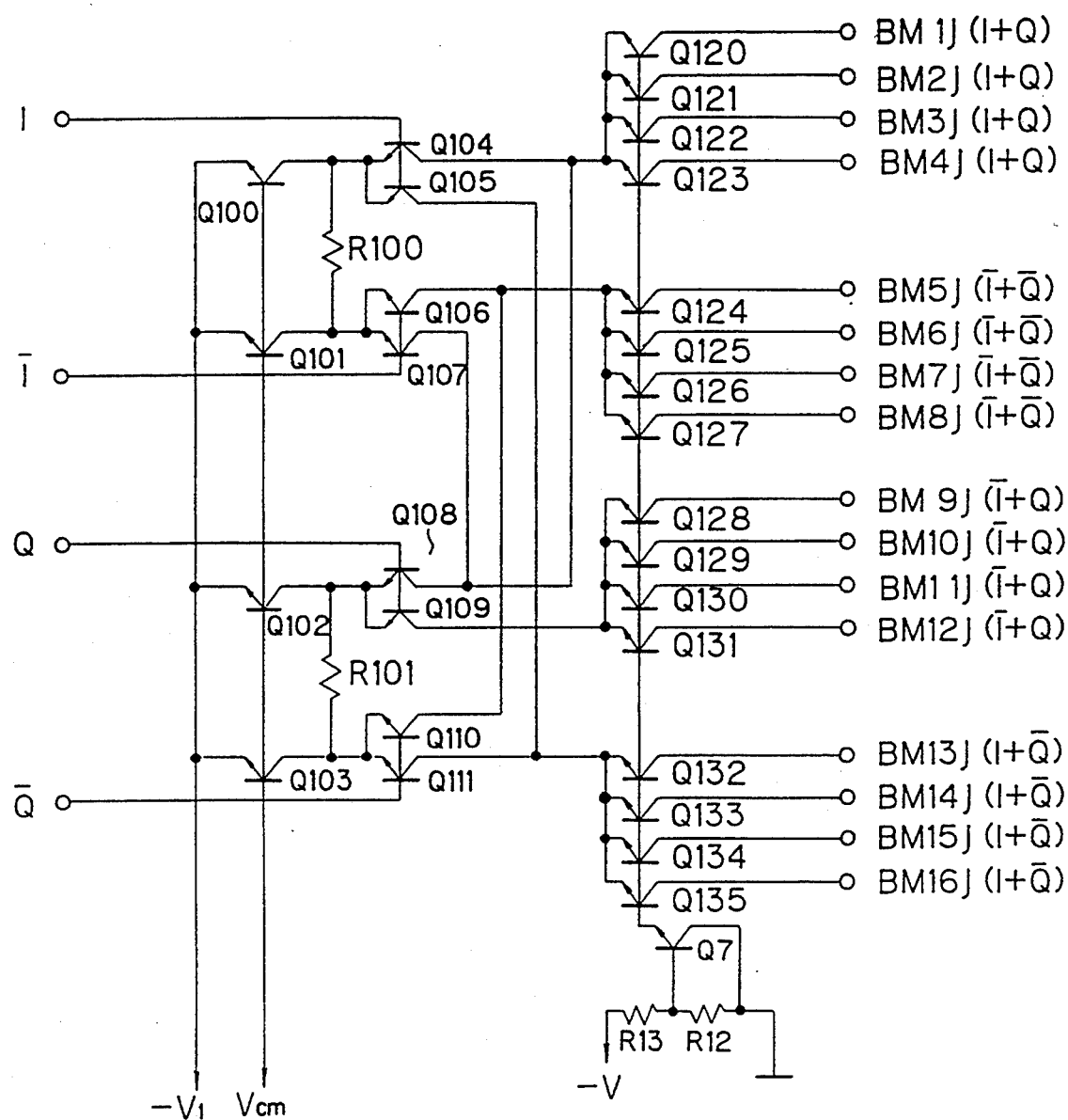
FIG. 11 is a circuit diagram of a modification of the circuit of FIG. 10 in the case where K=4.

FIG. 11 is a circuit diagram of an example of a branch metric calculation circuit in the case where constraint length K=4, constructed by extending the concept of the circuit shown in FIG. 10. While each branch metric $I+Q$, $\bar{I}+Q$, $\bar{I}+Q$, $I+\bar{Q}$ is distributed into two branch metrics in the case where K=3, each branch metric is distributed into four in the circuit of FIG. 11. Therefore, sixteen transistors Q120 to Q135 are required as grounded base type current adders.

Figure 12:
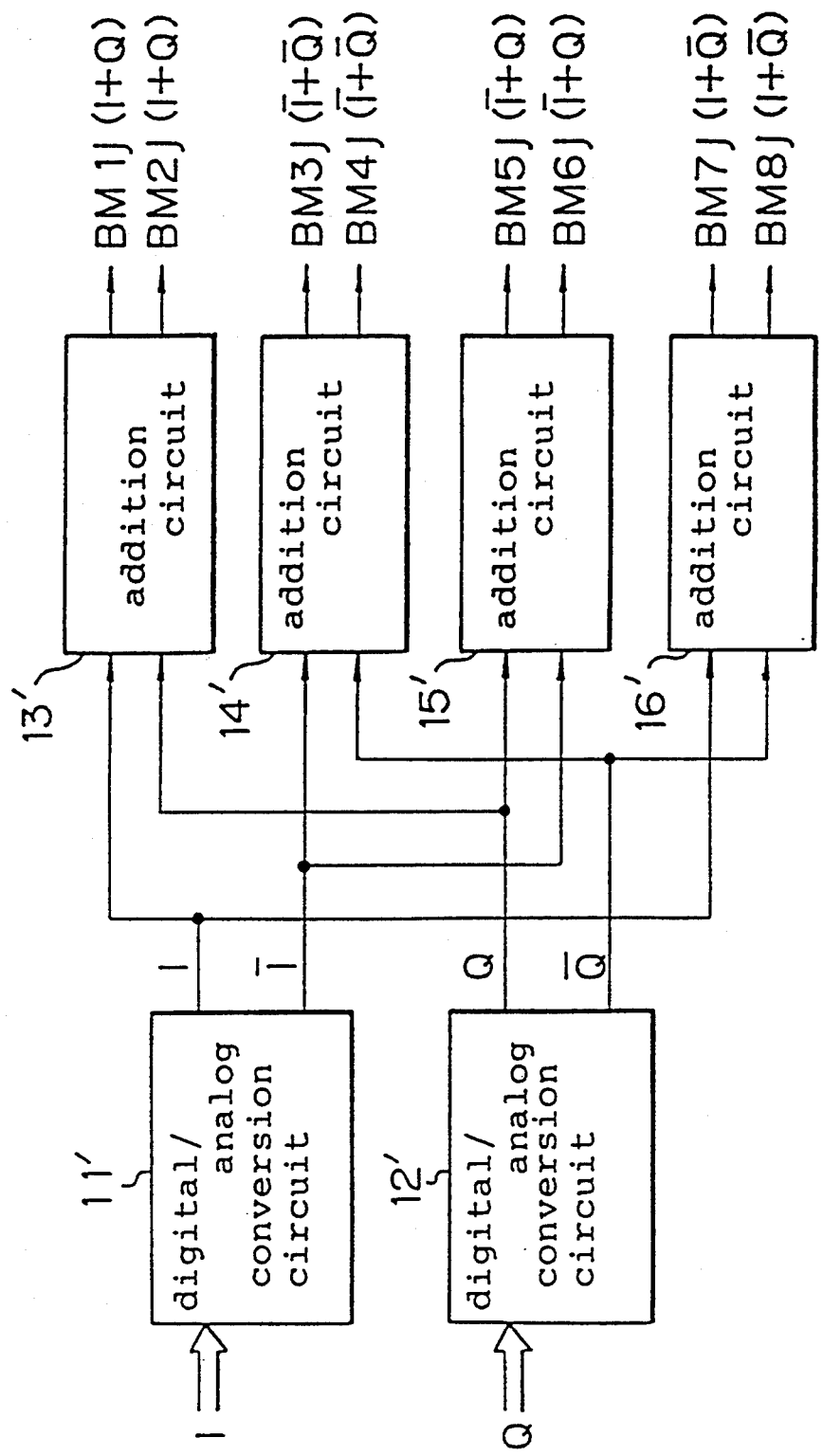
FIG. 12 is a block diagram showing a construction of a second example of the branch, metric calculation circuit.

FIG. 12 is a block diagram showing a second example of the construction of the branch metric calculation circuit (FIG. 6), in the case where the demodulated signals I and Q are input in the form of a plurality of bits of digital signals. This example is adapted to the case wherein a punctured coding is employed together with the convolutional coding. The punctured coding is a coding method that elevates the information rate by transmitting eliminated and compressed code at the transmitter side and by inserting dummy bits in the eliminated position and decoding at the receiver side. Insertion of the dummy bits is carried out by a digital signal process because it is more advantageous than an analog signal process. Accordingly, digital signals are input to the Viterbi decoder in a next stage.

Digital/analog conversion circuit 11' and 12' convert the input multi-bit I phase and Q phase signals to current signals and output them. The following addition circuits 13' to 16' have a similar construction to the addition circuits 13 to 16 of FIG. 7.

Figure 13:
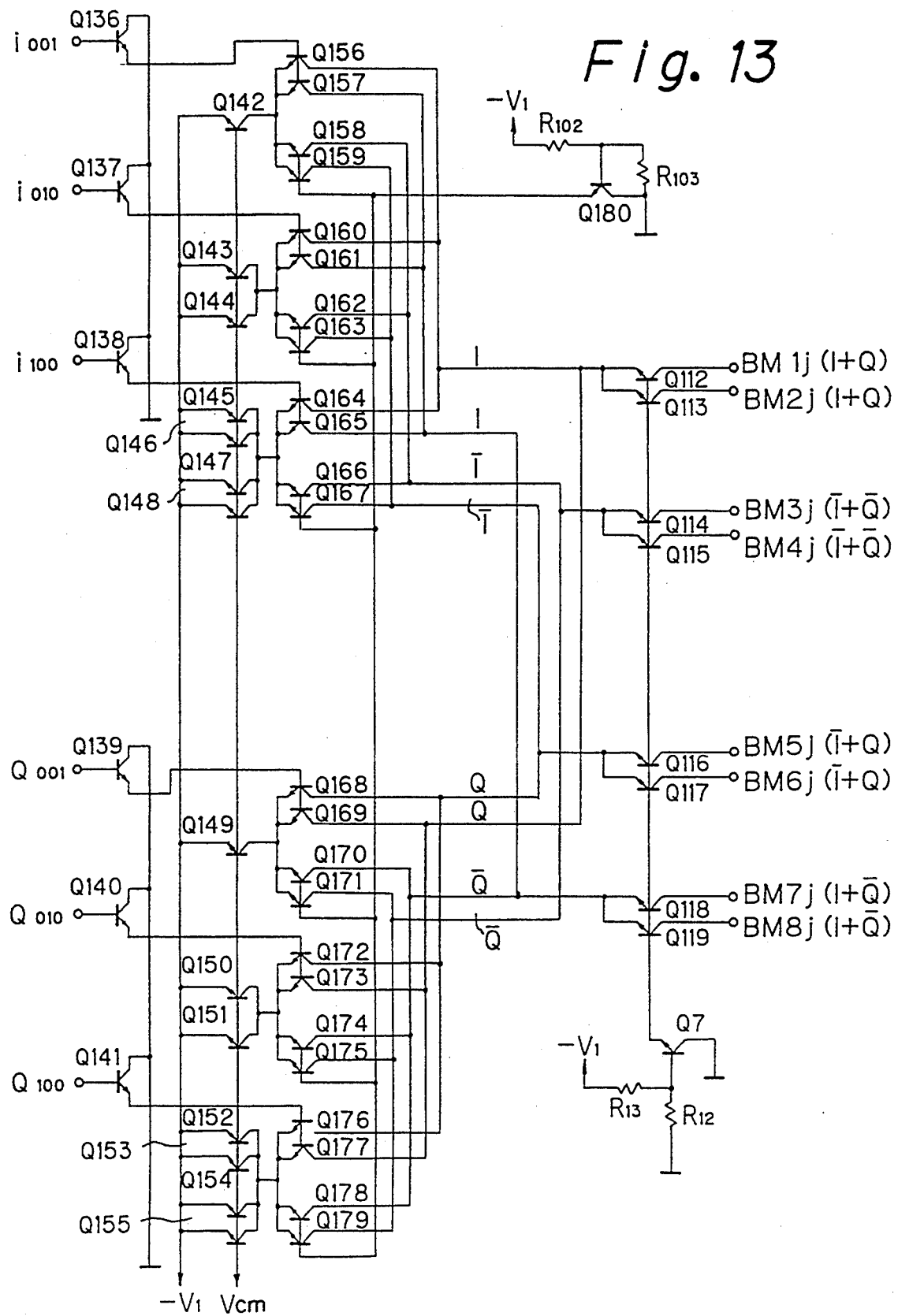
FIG. 13 is a detailed circuit diagram of the branch metric calculation circuit shown in FIG. 12.

FIG. 13 is a detailed circuit diagram of the branch metric calculation circuit of FIG. 12. An I phase signal and Q phase signal are input as 3 bit ECL level signals $i_{001}$, $i_{010}$, $i_{100}$, and $Q_{001}$, $Q_{010}$, $Q_{100}$, respectively. Q136 to Q141 constitute emitter follower circuits for impedance conversion of the input signals. Q156, Q157 and Q158, Q159 constitute an emitter coupled circuit, wherein the output signal of Q136, namely, $i_{001}$ is input to base terminals of Q156, Q157, and wherein a voltage corresponding to a threshold value of the ECL determined by a voltage $-V_1$ and resistors R102, R103 is applied through an emitter follower circuit of Q180 to base terminals of Q158, Q159. Accordingly, when the input $i_{001}$ is higher than the threshold value, namely, logic "1", current from a constant current source Q142 flows through Q156, Q157, and when the input is logic "0", the current flows through Q158, Q159. Q160 to Q163 and Q164 to Q167 also constitute emitter coupled circuits, but values of currents when conducting become twice and four times, respectively, because two and four transistors as constant current sources are connected in parallel. The numbers correspond to weights of the input signals $i_{001}$, $i_{010}$, $i_{100}$. The outputs of Q156, Q160, Q164 and Q157, Q161, Q165 are connected to each other in that order by wires, and such outputs are current signals corresponding to an I phase signal. Similarly, the outputs of Q158, Q162, Q166 and Q159, Q163, Q167 are current signals corresponding to $\bar{I}$.

Similarly, a circuit constituted by Q139 to Q141, Q149 to Q155, and Q168 to Q179 outputs two current signals corresponding to Q and two current signals corresponding to $\bar{Q}$. Q112 to Q119 operate as grounded base type current addition circuits as described in FIG. 9, and output branch metrics $BM1_j$ to $BM8_j$ in the form of current signals.

Figure 14:
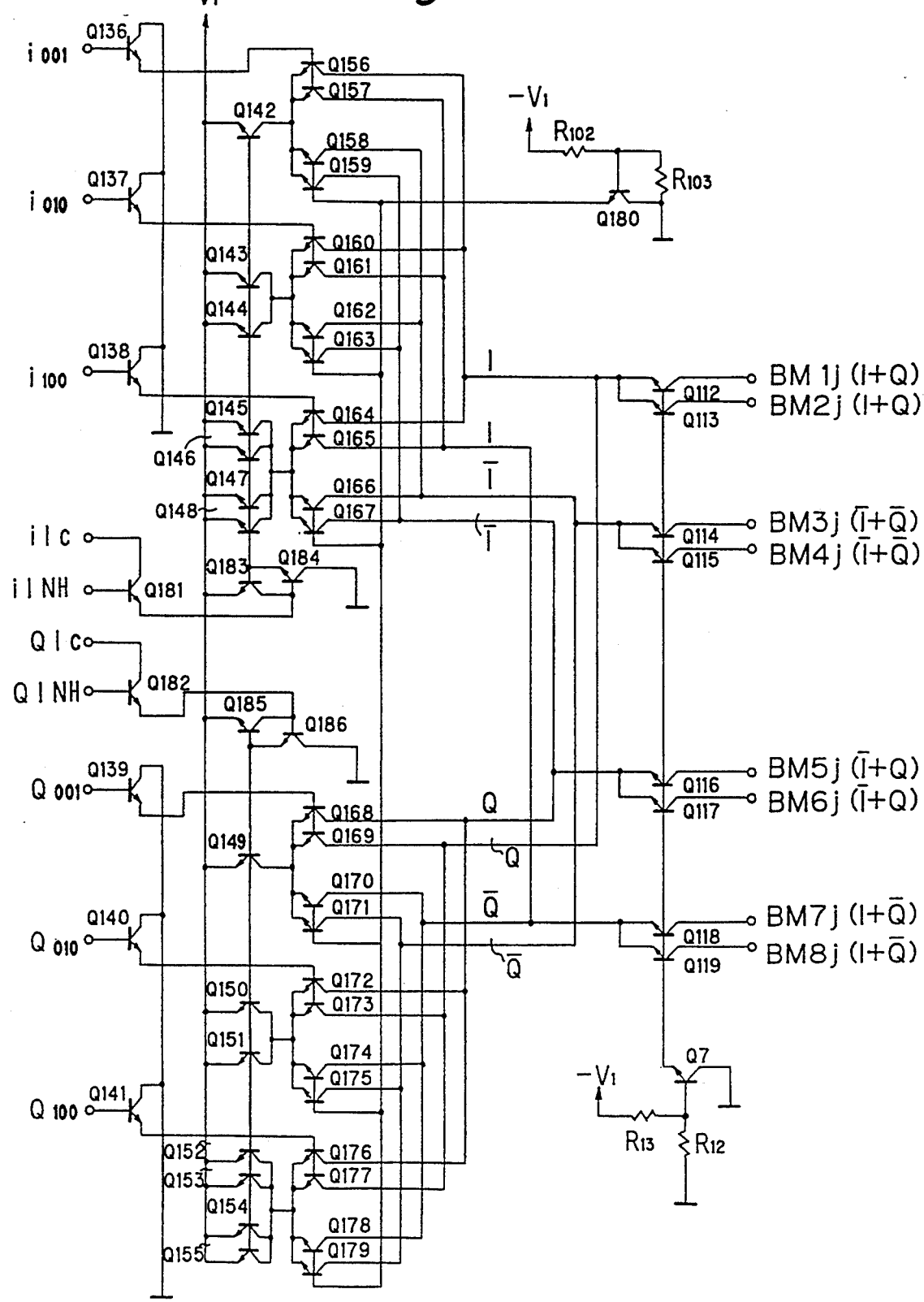
FIG. 14 is a circuit diagram of a modification of the circuit diagram of FIG. 13.

FIG. 14 shows a circuit similar to that of FIG. 13. However, a circuit is added to eliminate the effect of the dummy bit on the path metric calculation by making the current outputs of I and $\bar{I}$ or Q and $\bar{Q}$ zero while the dummy bit is input, in the case where the preceding stage is a dummy bit inserting circuit, to decode the punctured codes.

Q183 and Q184 constitute a part of a current mirror circuit to apply constant voltages to base terminals of constant current sources Q142 to Q148. A constant current to be supplied to the circuit is supplied from a terminal iIc through a transistor Q181. Therefore, if the level of a signal input to a terminal iINH connected to a base terminal of Q181 is low, then Q181 does not conduct, the current supplied to the current mirror circuit becomes zero, and the current outputs I and $\bar{I}$ are forced to be zero. As described later, the constant current supplied to the terminal iIc is varied in response to a variation in power source $+V_2$ in order to cancel the effect of variation of $+V_2$ which is used in an ACS circuit at the next stage.

The circuit constituted by Q182, Q185, and Q186 operates similarly so that the current outputs Q and $\bar{Q}$ are forced to be zero while a signal input to a terminal QINH is at a low level.

Figure 15:
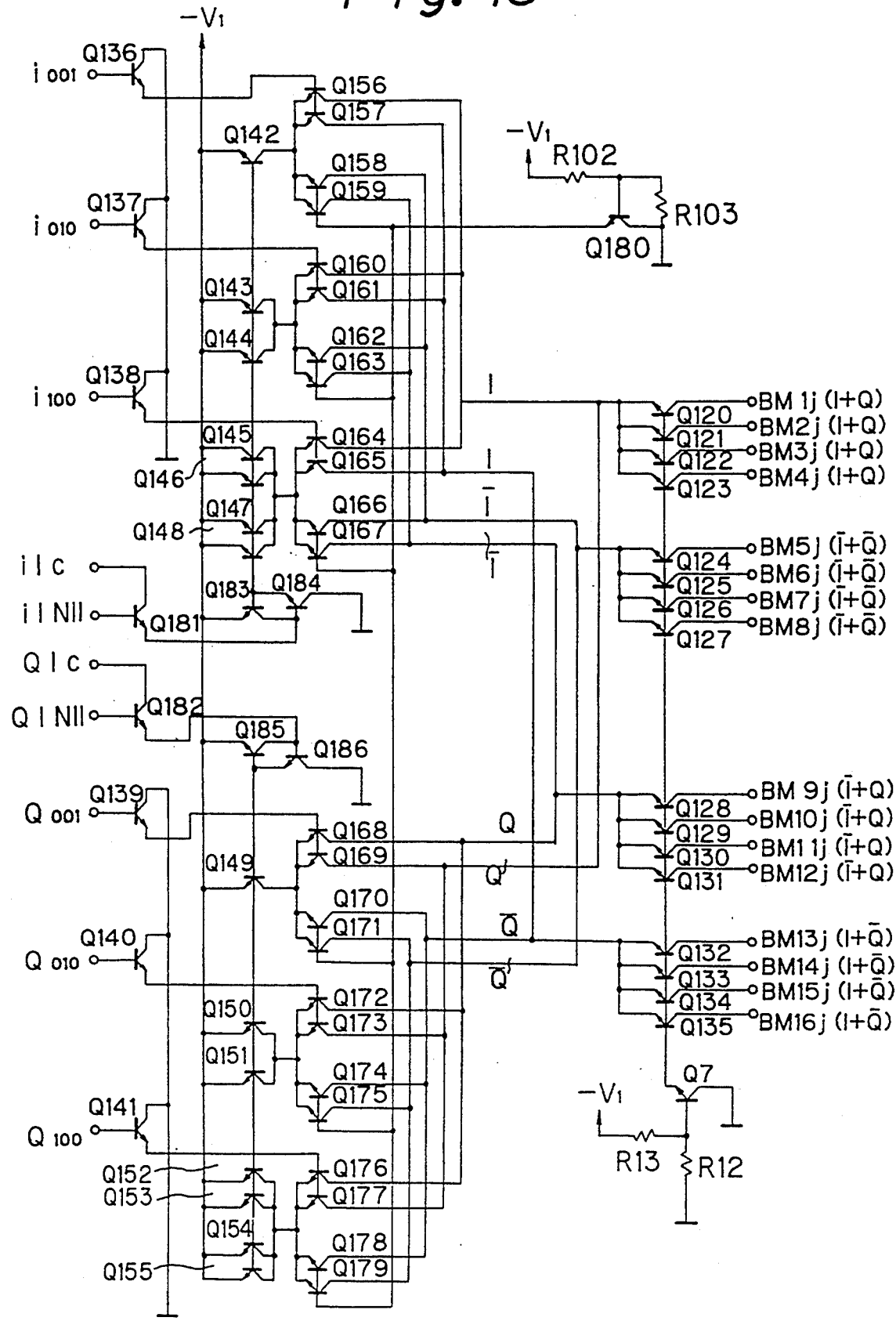
FIG. 15 is a circuit diagram of a modification of the circuit shown in FIG. 14, in the case where K=4.

A circuit shogun in FIG. 15 is a modified circuit of FIG. 14 intended for a constraint length of cope K=4.

Figure 16:
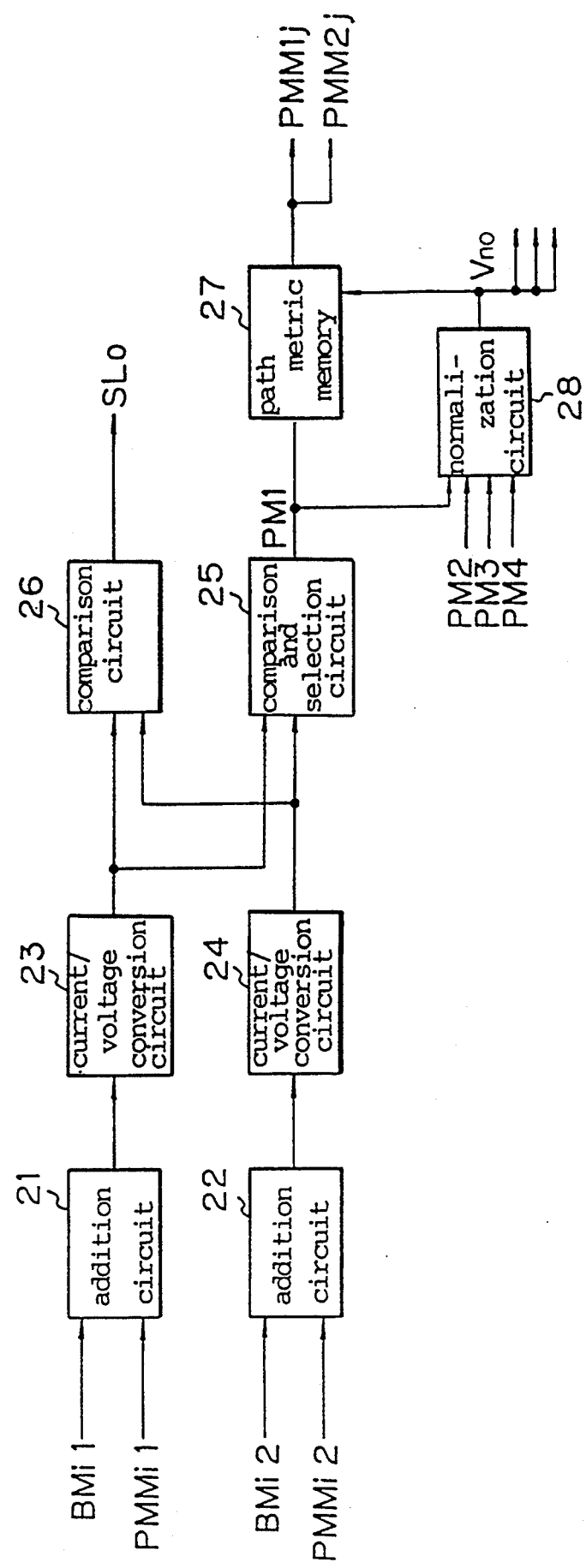
FIG. 16 is a block diagram showing a construction of an ACS circuit unit.

FIG. 16 is a block diagram showing a detailed construction of one ACS circuit unit of the ACS circuit 2 shown in FIG. 6. The ACS circuit 2 comprises $2^{K-1}$ ACS circuit units having this construction.

A signal BMi1 is an output signal of the aforementioned branch metric calculation circuit (i denotes the address of a connected branch metric calculation circuit, and is determined by the generator polynomial of the convolutional code). A signal PMMi1 is a last value of the path metric which is output from a path metric memory 27 (described later) comprised in this ACS circuit unit or another ACS circuit unit. Current signals corresponding to the BMi1 and PMMi1 are input to an addition circuit 21 which adds up the signals and outputs them as a current signal. Similarly, an addition circuit 22 adds up BMi2 and PMMi2 and outputs them. Current/voltage conversion circuits 23 and 24 convert the current signals output from the addition circuits 21 and 22 into voltage signals and output them. A comparison circuit 26 compares the voltage signals output from the current/voltage conversion circuits 23 and 24, and outputs a digital signal indicating which path metric value is smaller than the other. A comparison and selection circuit 25 also compares the output signals of the current/voltage conversion circuits 23 and 24, and outputs a voltage signal PM1 which corresponds to the smaller path metric value. A normalization circuit 28 compares path metric values from all the ACS circuit units (in the case where K=3, PM1 to PM4), and outputs a voltage Vno corresponding to the minimum value thereof. A path metric memory 27 holds the output PM1 from the comparison and selection circuit 25 during one cycle period, and normalizes by subtracting Vno from the PM1 to be output as PMM1$_j$ and PMM2$_j$. j's denote addresses of the addition circuits 21 or 22, etc., to be connected, and are determined by the generator polynomial.

Figure 17:
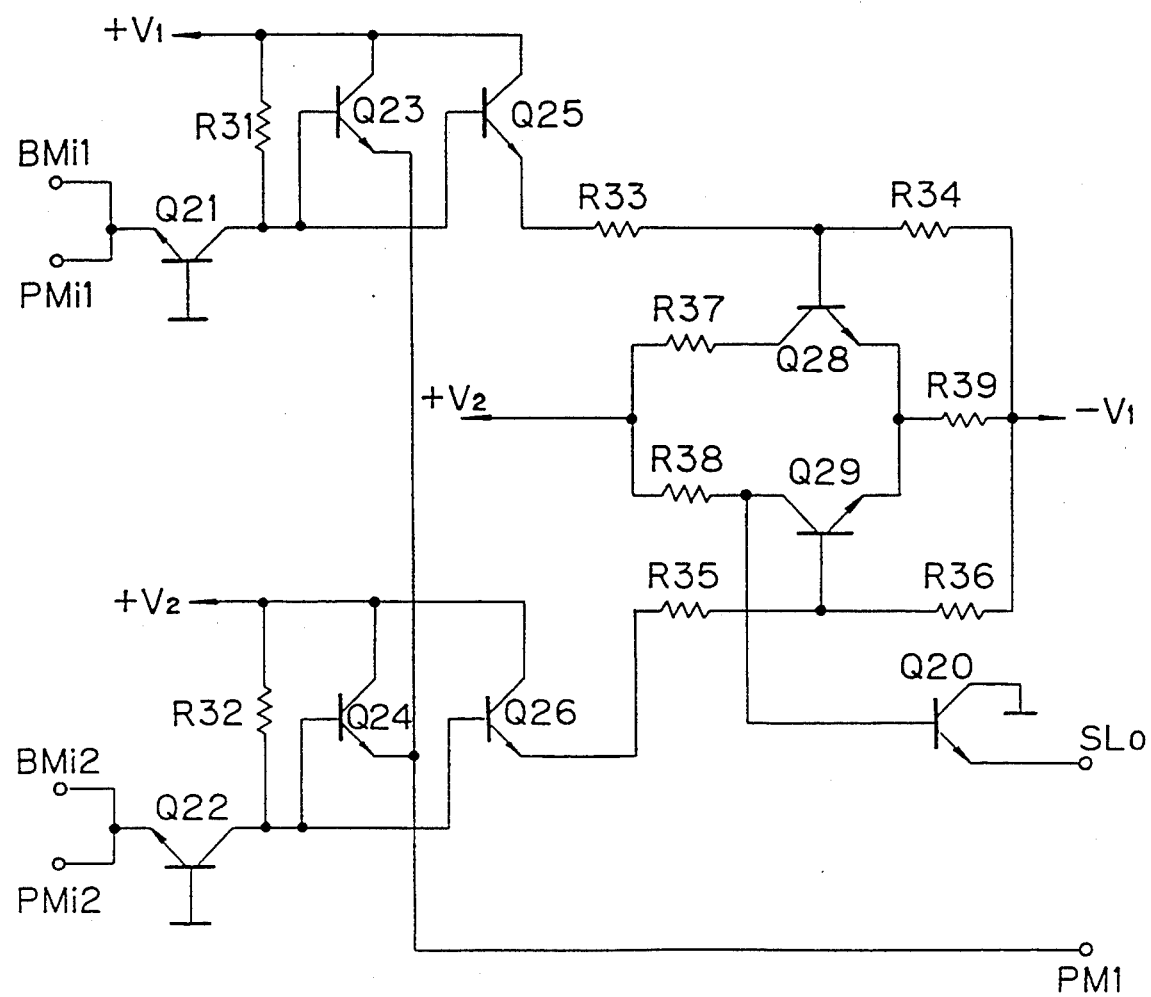
FIG. 17 is a circuit diagram showing an example of a detailed circuit construction of the addition circuit, the current/voltage transfer circuit, comparison circuit-/and comparison/selection circuit.

FIG. 17 is a circuit diagram showing an example of a detailed circuit construction of the addition circuits 21 and 22, the current/voltage conversion circuit 23 and 24, the comparison circuit 26, and the comparison and selection circuit 25 shown in FIG. 16.

The addition circuit 21 is realized by a transistor Q21, the addition circuit 22 is realized by a transistor Q22, the current/voltage conversion circuit 23 is realized by a resistor R31, the current/voltage conversion circuit 24 is realized by a resistor R32, the comparison circuit 26 is realized by transistors Q28, and Q29, Q20 and resistors R33 to R39, and the comparison and selection circuit is realized by the transistors Q23 and Q24.

The transistors Q21 and Q22 constitute grounded base type current addition circuits. Added currents are converted into voltages by the resistors R31 and R32.

Electrical potentials at one side of R31 and R32 become higher as the path metric value becomes smaller. Q25 and Q26 operate as emitter followers to separate output from input, and their output signals correspond to the path metric values. R33, R34 and R35, R36 are voltage dividers to convert a signal level. Q28, Q29, and R37 to R39 constitute a differential amplifier having a sufficient gain, which operates as a comparator. When the voltage applied through Q25 is higher than the voltage applied through Q26 (when the path metric value is smaller), an output signal SLO is at a high level. Q20 is an emitter follower to separate output from input. An electrical potential at the emitter terminals of Q23 and Q24 is controlled by the transistor having a higher base potential because the emitter terminals thereof are connected together. Thus, the electrical potential becomes PM1.

The two adders are realized by the two transistors as is in the branch metric calculation circuits. The current metrics added up in the adder Q21 and Q22 are converted into a voltage metric by the resistors R31 and R32. As mentioned above, though accuracy and temperature dependency of values of resistance vary greatly, relative values thereof are good. Therefore, the converted voltage metrics are hardly affected by dispersion of the resistance or the temperature dependency. The reason is as follows. If the resistances are increased by 10%, all current signals determined by the resistances are decreased by 10%. Nevertheless, since the resistances R31 and R32 to convert the currents into voltages are also increased by 10%, the voltage drops across the resistances are not altered.

In addition to the adders, the comparison circuits and comparison and selection circuits are realized by much simpler circuits than digital circuits. While an 8-bit comparator requires 56BC in the digital circuits, the present circuits are almost entirely realized by only two transistors.

Figure 18:
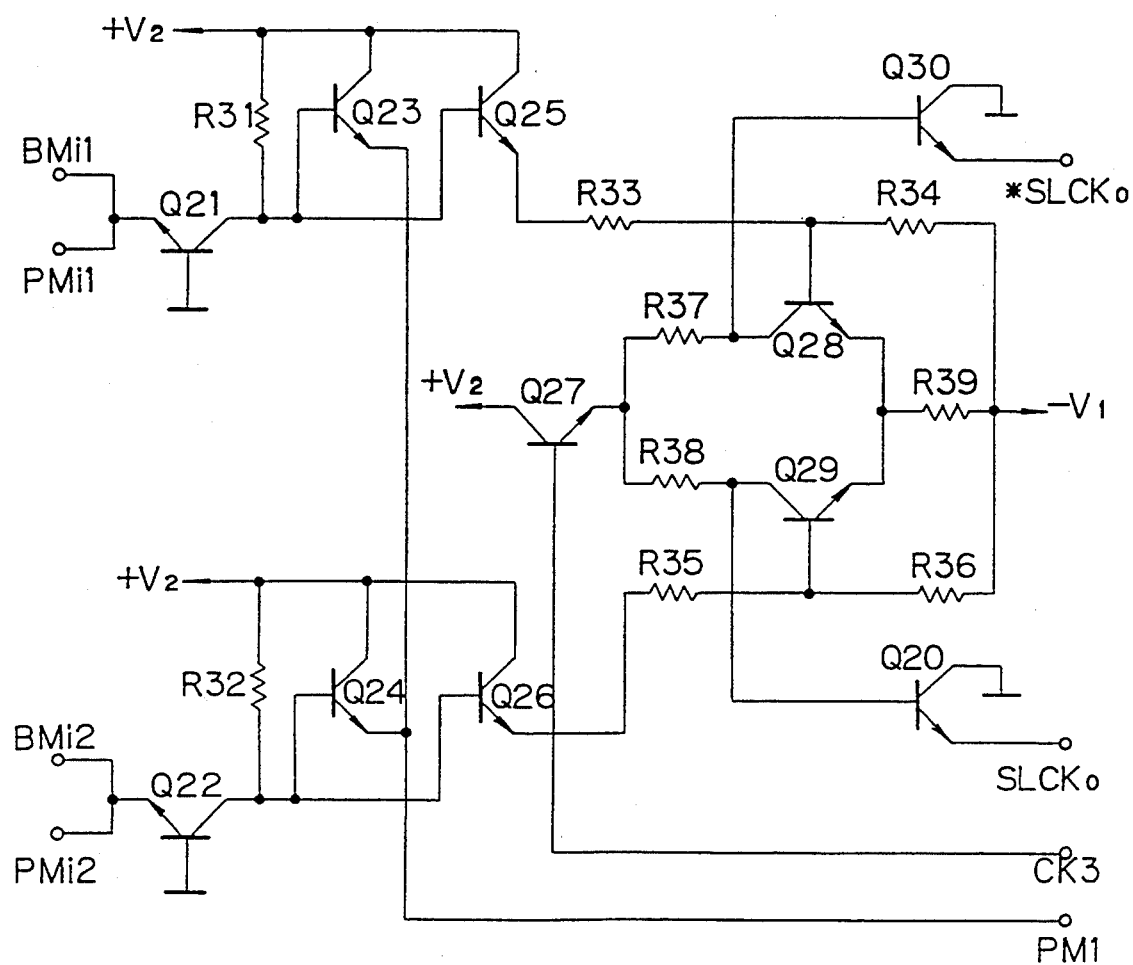
FIG. 18 is a circuit diagram of a modification of the circuit shown in FIG. 17.

A circuit shown in FIG. 18 is a first modification of the circuit shown in FIG. 17. FIG. 18 shows a circuit wherein a clock CK3 is introduced in order to simplify the path memory circuit in the following stage, and a signal SLCKO in the form of the path select signal SLO masked during the latter half of the clock and an inverted signal SLCKO thereof are output.

Figure 19:
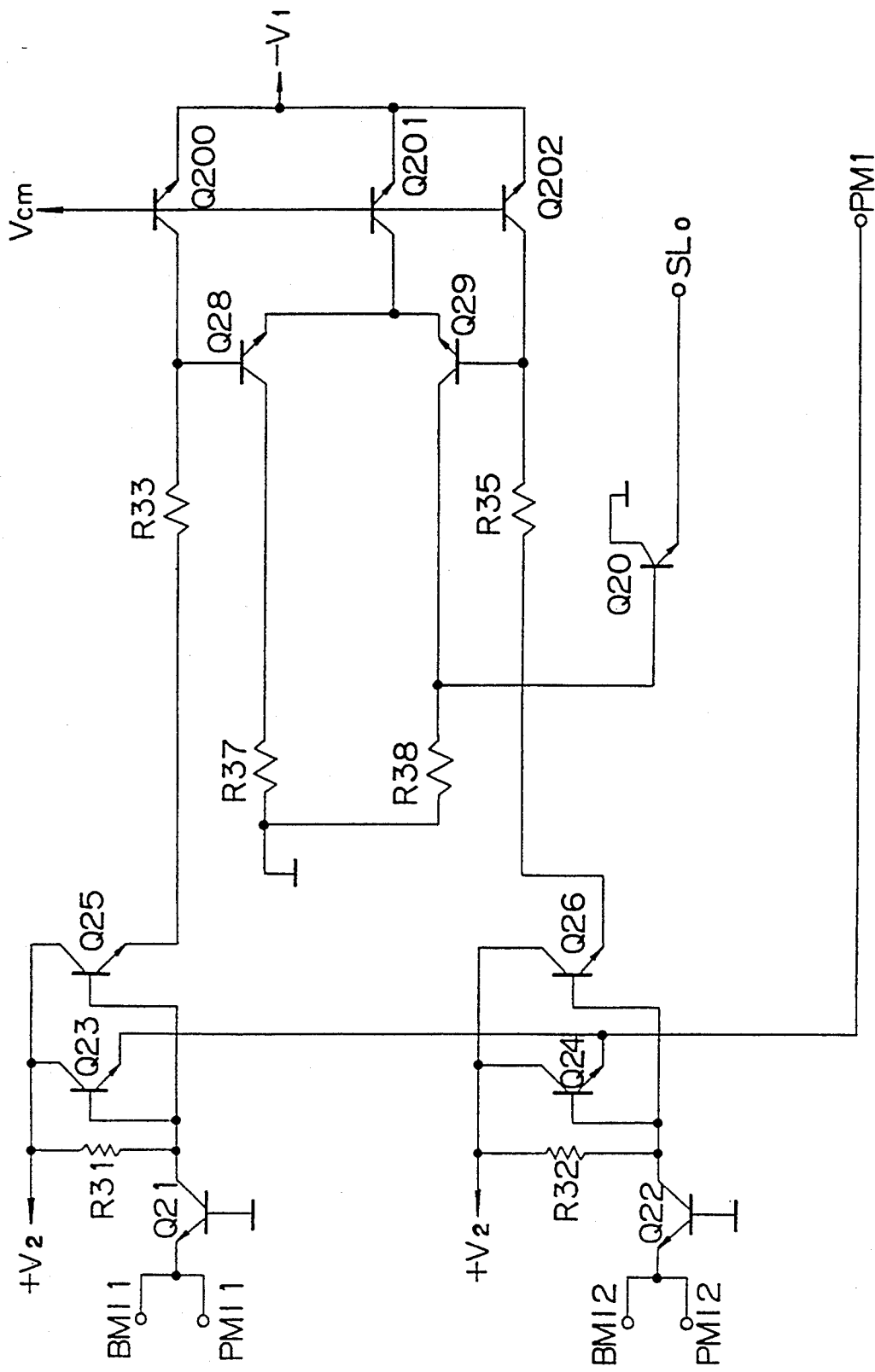
FIG. 19 is a circuit diagram of another modification of the circuit shown in FIG. 17.

A circuit shown in FIG. 19 is a second modification of the circuit shown in FIG. 17. R34, R39 and R36 of FIG. 17 are replaced by transistors Q200, Q201 and Q202 which operate as constant current sources. The constant voltage Vcm of the current mirror circuit described with reference to FIG. 9 is applied to base terminals of Q200, Q201 and Q202. Accordingly, levels of output voltages of Q25 and Q26 are shifted by $i_0 \times R33$ and $i_0 \times R35$, respectively, to be applied to base terminals of the differential transistors Q28 and Q29. Additionally, since a common point of R37 and R38 is not connected to +V2 but is grounded, a path memory circuit constructed by ECL components can be connected thereto.

Figure 20:
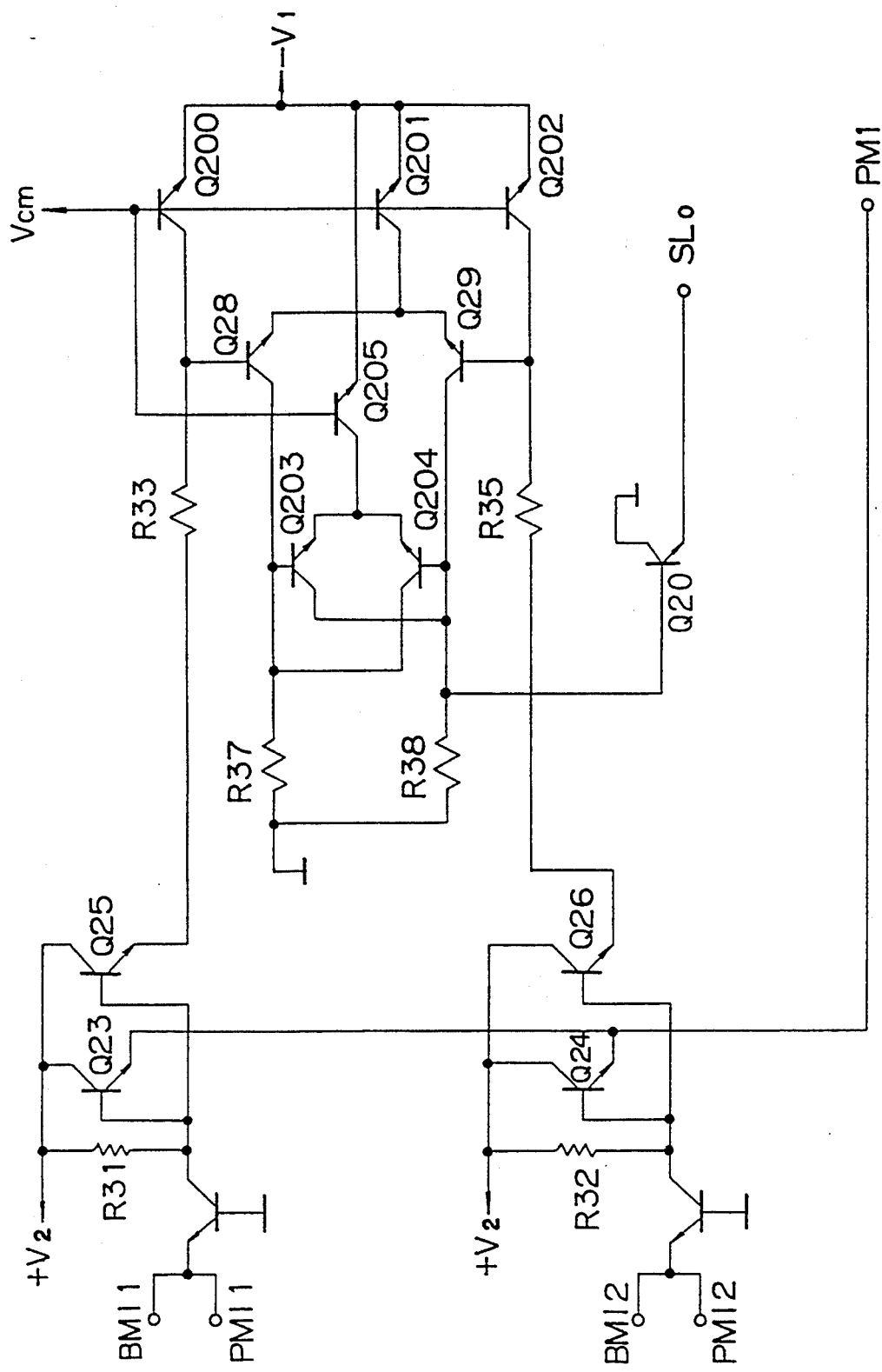
FIG. 20 is a circuit diagram of a modification of the circuit shown in FIG. 19.

A circuit shown in FIG. 20 is a modification of the circuit shown in FIG. 19, wherein a circuit constituted by Q203 to Q205 is added. Since voltage amplification of a real differential amplifier can not be infinite because of the existence of an emitter resistance of the transistor itself, there is a case where the level of an output signal cannot reach full digital signal levels when the level difference of the input signals is small. The positive feedback circuit constituted by Q203 to Q205 serves to make the levels of output signals full digital signal levels. For example, when the electrical potential of the base terminal of the Q29 is slightly higher than that of Q28, the amount of current flowing through R38 becomes higher than the amount of current flowing through R37, so that the electrical potential of the base terminal of Q203 becomes higher than that of Q204. To this end, still more current flows through R38, and the output voltage is lowered even more. The circuit is a so-called latch circuit wherein the aforementioned positive feedback makes Q204 and Q203 completely turned-off and turned-on, respectively.

Figure 21:
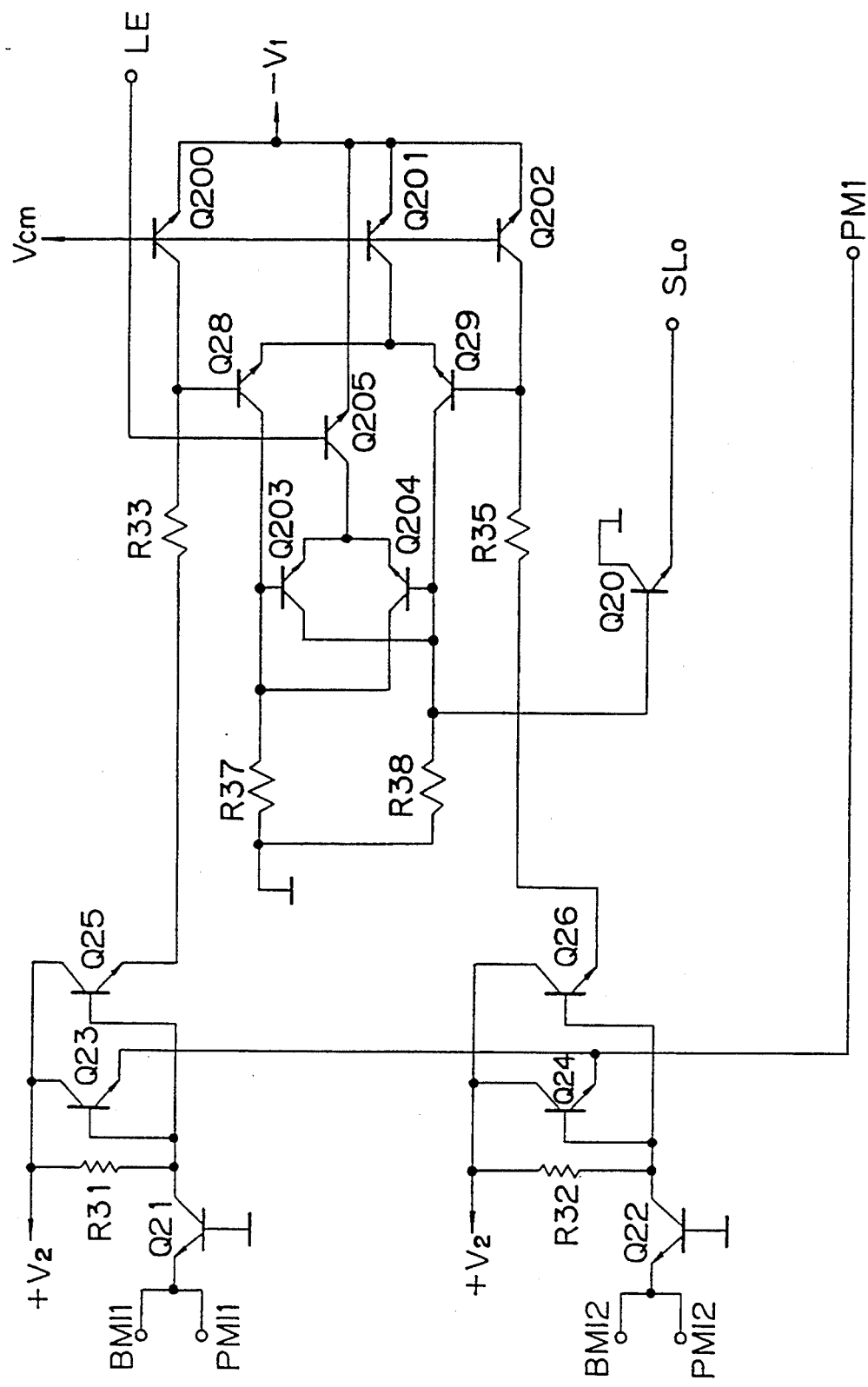
FIG. 21 is a circuit diagram of a modification of the circuit shown in FIG. 20.
Figure 22:
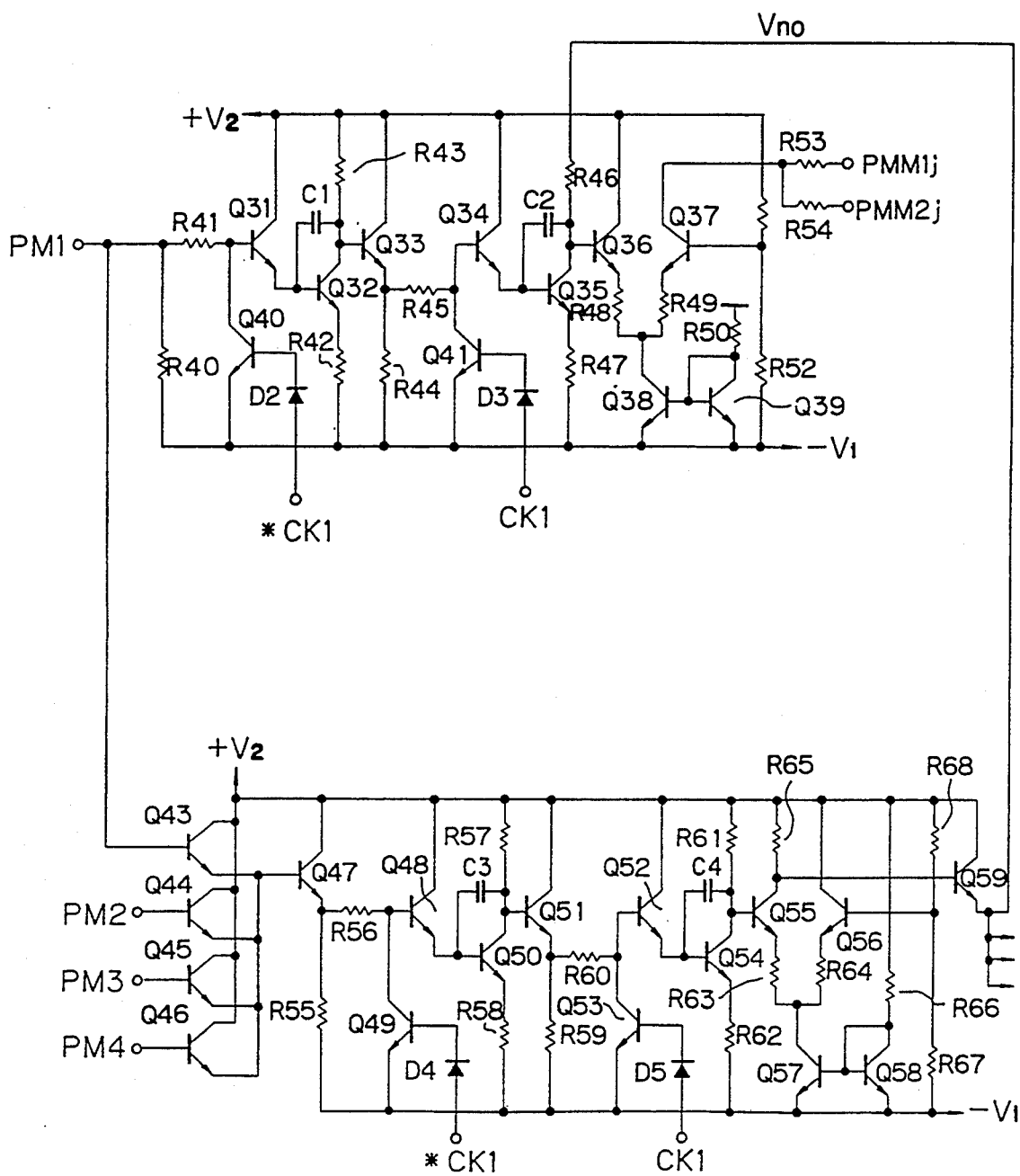
FIG. 22 is a circuit diagram showing a first example of a detailed circuit construction of the path metric memory and the normalization circuit shown in FIG. 16.

FIG. 21 shows a more improved circuit of FIG. 20. In the circuit of FIG. 21, current flowing through Q205 is turned-off by lowering the level of a latch enable signal (LE) at predetermined periods of calculation intervals, to nullify a hysterisis characteristic, so that an exact decision is made in the case where the difference between input signals is small. FIG. 22 is a diagram showing a first example of a detailed circuit construction of the path metric memory 27 and the normalization circuit 28 shown in FIG. 16. The upper portion of FIG. 22 corresponds to the path metric memory 27 and the lower portion corresponds to the normalization circuit 28.

While a clock CK1 is at H level (*CK1 is at L level), Q40 does not conduct and Q41 conducts. In this situation, a capacitance C1 is charged up to a voltage corresponding to a voltage of PM1 with a time constant determined by C1 and R43. When the clock CK1 becomes L level (*CK1 is at H level), Q40 is turned-on and Q41 is turned-off. As Q31 is cut-off by conduction of Q40, C1 is discharged through the base terminal of Q32. However, the input impedance of the base terminal is sufficiently high compared with R43, due to the effect of negative feedback by the emitter resistor R42.

Accordingly, the collector voltage of Q32 is held at a constant value during the latter half period of the clock CK1, to perform a sample/hold operation. (In the case where the clock rate is low, the capacitance of the C1 must be a large value).

When Q40 is turned-on and Q31 is cut-off, Q34 is turned-on because Q41 is turned-off. To this end, the collector voltage of Q32 is transferred through Q33 and Q34 to the next sample/hold circuit constituted by Q35, C2, and R46.

When the clock CK1 becomes H level (*CK1 is at L level), Q41 is turned on to separate the former and the latter stages. Then in the latter stages a sample/hold operation is performed as in the former stage.

Additionally, in the latter stage, normalization of the path metric is performed by subtracting a voltage Vno corresponding to a normalization metric from the normalization circuit in the lower half of FIG. 22.

The source voltage for the collector of Q35 becomes ground potential when the normalization voltage Vno is maximum, becomes $+V_2$ when Vno is minimum, and is shifted between these values in response to the value of the normalization voltage Vno. The collector voltage of Q35 is shifted by the shifted quantity of the source voltage toward a direction where the path metric (v) is decreased, and thus the normalization is performed. The normalized path metric (v) is converted into a current path metric (i) again by a differential amplifier constituted by Q36 to Q39, and is supplied to its own ACS or another ACS as the past path metrics PMM1j and PMM2j.

Thus, in the path metric memory of the present invention, two sample/hold circuits are provided wherein read/write operations are executed in individual half cycles to store the analog values.

Figure 23:
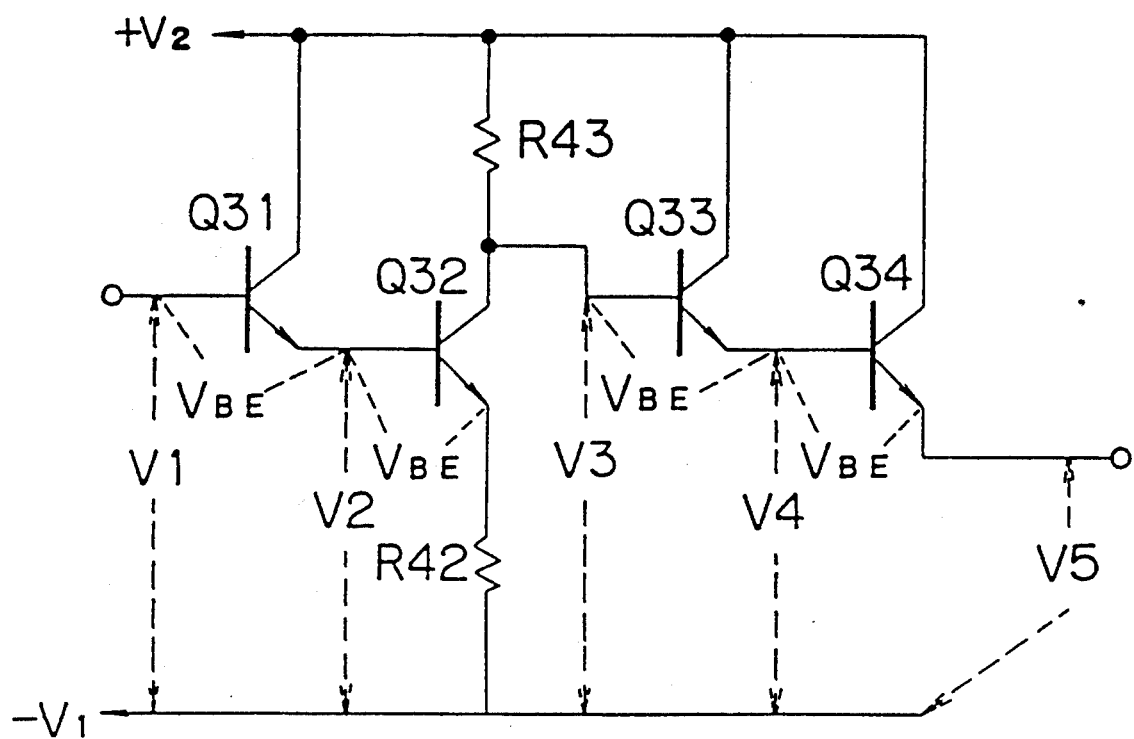
FIG. 23 is a diagram for explaining an operation of the circuit shown in FIG. 22.

A direct-coupled amplifier constituted by four transistors Q31 to Q34 shown in FIG. 23 corresponds to the transistors Q31 to Q34 of the path metric memory circuit shown in FIG. 22. In this circuit the relationship of V1 to V5 is as follows.

$$V_5 = V_{cc} - V_1(R43/R42) + 2V_{BE}(R43/R42) - 2V_{BE}. \quad (1)$$

wherein it is assumed that $I_B = 0$, $I_c = I_E$ and $V_{BE}$'s of Q31 to Q34 are equal to each other.

Further, if R43=R42, the following equation (2) is obtained, and thus $V_{BE}$'s are nullified.

$$V_5 = V_{cc} - V_1 \ldots \quad (2)$$

As explained with reference to FIG. 17, degradation of accuracy of the metric value due to dispersion of resistances hardly occurs.

A circuit shown in the lower half of FIG. 22 is a normalization circuit. The circuit receives path metrics (v) in the form of voltage signals from four ACS's (eight where K=4), selects a minimum value from among them, stores the analog quantity in two sample/hold circuits at the same timing as the path metric memory, and supplies a level converted normalization metric Vno to each ACS.

In Q43 to Q46, as described for the operation of the ACS, an input having the highest potential (the lowest path metric value (v)) among four inputs is output.

Two sample/hold circuits (Q47 to Q54, C3, C4, and R55 to R62) store and reserve a normalization metric (v) as an analog quantity, in the same arrangement as the path metric memory.

The normalization metric (v) is temporarily converted into current metric (i) in a differential amplifier (Q55 to Q58, R63 to R68) for level conversion, and is again converted into a normalization metric (v) in the form of a voltage signal.

An emitter follower (Q59) at the output end is necessary for preventing interference with currents from collectors of Q35 of ACS's.

In the normalization circuit of the present invention, the comparison and selection circuit to select the smallest value from among voltage path metrics (v) from four (eight) ACS's can be realized by four (eight) transistors.

It is apparent that an enormous number of BC's are required to realize the same function in a digital circuit. Even though realized, operation speed would be lost, so that another way (When all of MSB's of registers for ACS's are "1", all of them are drawn back to "0") must be employed.

Figure 24:
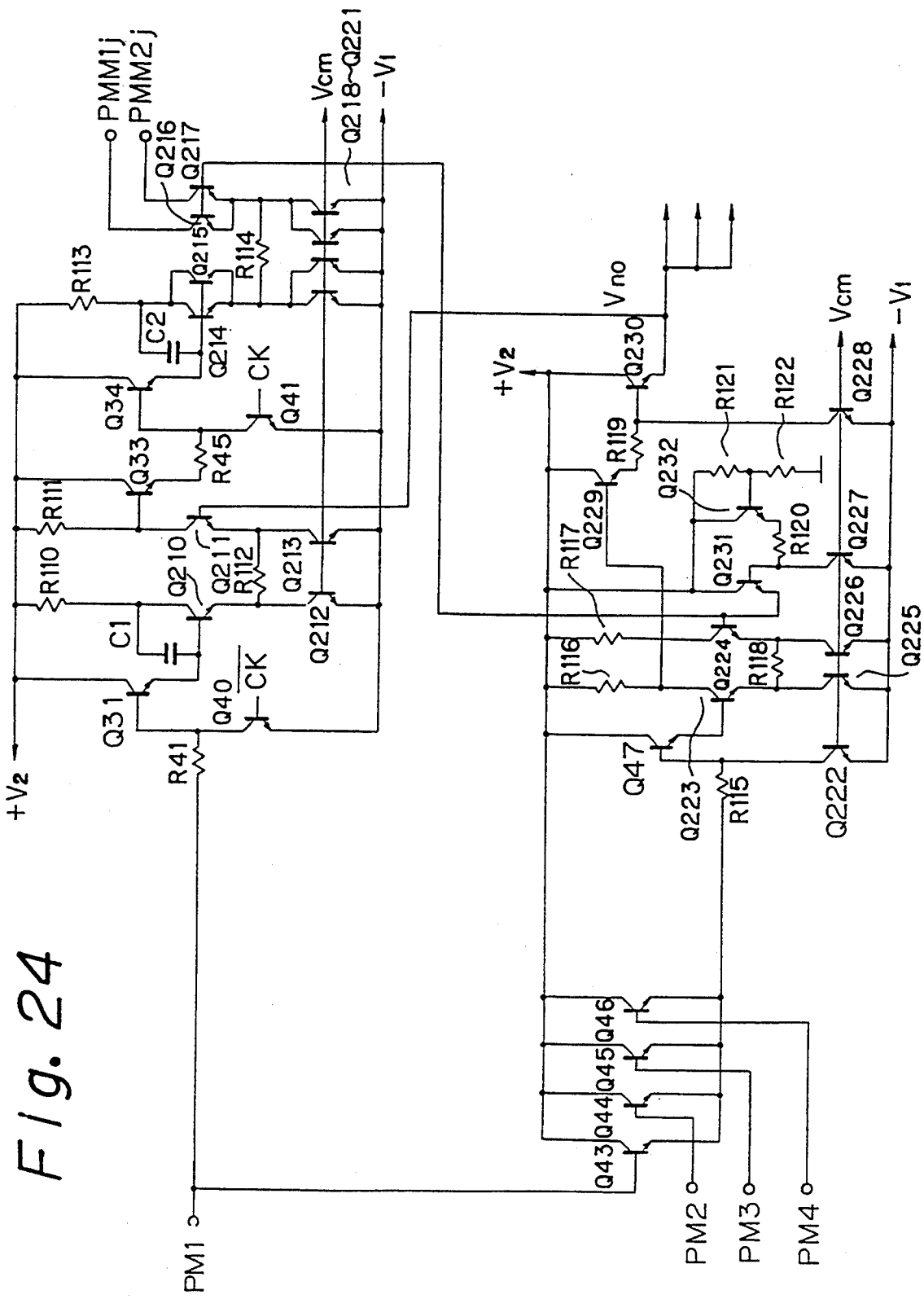
FIG. 24 is a circuit diagram showing a second example of a detailed circuit construction of the path metric memory and the normalization circuit shown in FIG. 16.

FIG. 24 is a diagram showing a second example of a detailed construction of the path metric memory 27 and normalization circuit 28 of FIG. 16. As is in FIG. 22, the upper half portion shows the path metric memory, and the lower half portion shows the normalization circuit.

Comparing with FIG. 22, the emitter grounded amplifier constituted by Q32, R43 and R42 of FIG. 22 is replaced by a seesaw differential amplifier (explained with reference to FIG. 10) constituted by Q210 to Q213 and R110 to R112, and a normalization voltage Vno is supplied to one input of the amplifier, to perform normalization. As the normalization is carried out in the first sample/hold circuit of the path metric memory circuit in real time, the normalization voltage does not need to be stored, and no sample/hold circuit needs to be provided in the normalization circuit (lower half portion). This is one of the merits obtained from using an analog circuit.

The differential amplifier constituted by Q36 to Q39 and R48 to R50 of FIG. 22 is also replaced by a seesaw differential amplifier. In this circuit, twice the number of transistors are used to obtain two current outputs. A voltage which is a division of $+V_2$ by resistors R121 and R122 is supplied through two stages of emitter followers of Q231 and Q232 and a level shifter of R120 to one input (base terminal of Q216 and Q217). The two stages of emitter followers are provided to match the number of stages of emitter followers (Q33 and Q34) in another input side, to cancel the temperature dependency of $V_{BE}$.

A voltage output from Q43 to Q46 corresponding to the normalization metric is supplied through a level shifter of R115 and an emitter follower of Q47 to one input of a seesaw differential amplifier constituted by Q223 to Q226 and R116 to R118. The aforementioned bias voltage is also supplied to another input. A non-inverted output of the differential amplifier is supplied through emitter followers of Q229 and Q230 and a resistor R119 as a level shifter to each of the path metric memories as a normalization voltage Vno.

Figure 25:
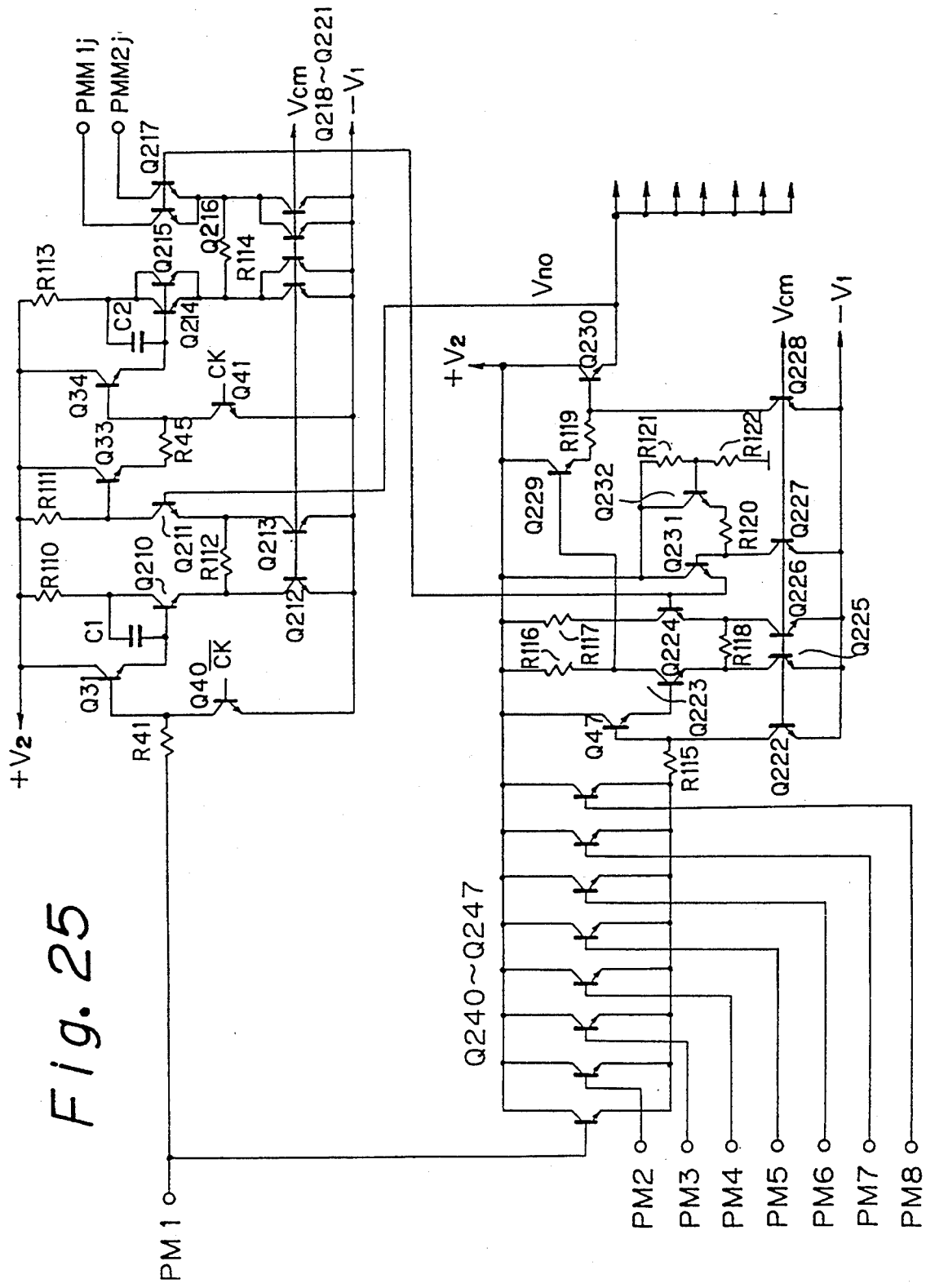
FIG. 25 is a circuit diagram showing a modification of the circuit of FIG. 24 in the case where K=4.

FIG. 25 shows a modification of the circuit shown in FIG. 24 in the case where K=4. Eight transistors Q240 to Q247 are provided at an input of the normalization circuit, and the normalization metric Vno is supplied to eight path metric memories.

Figure 26:
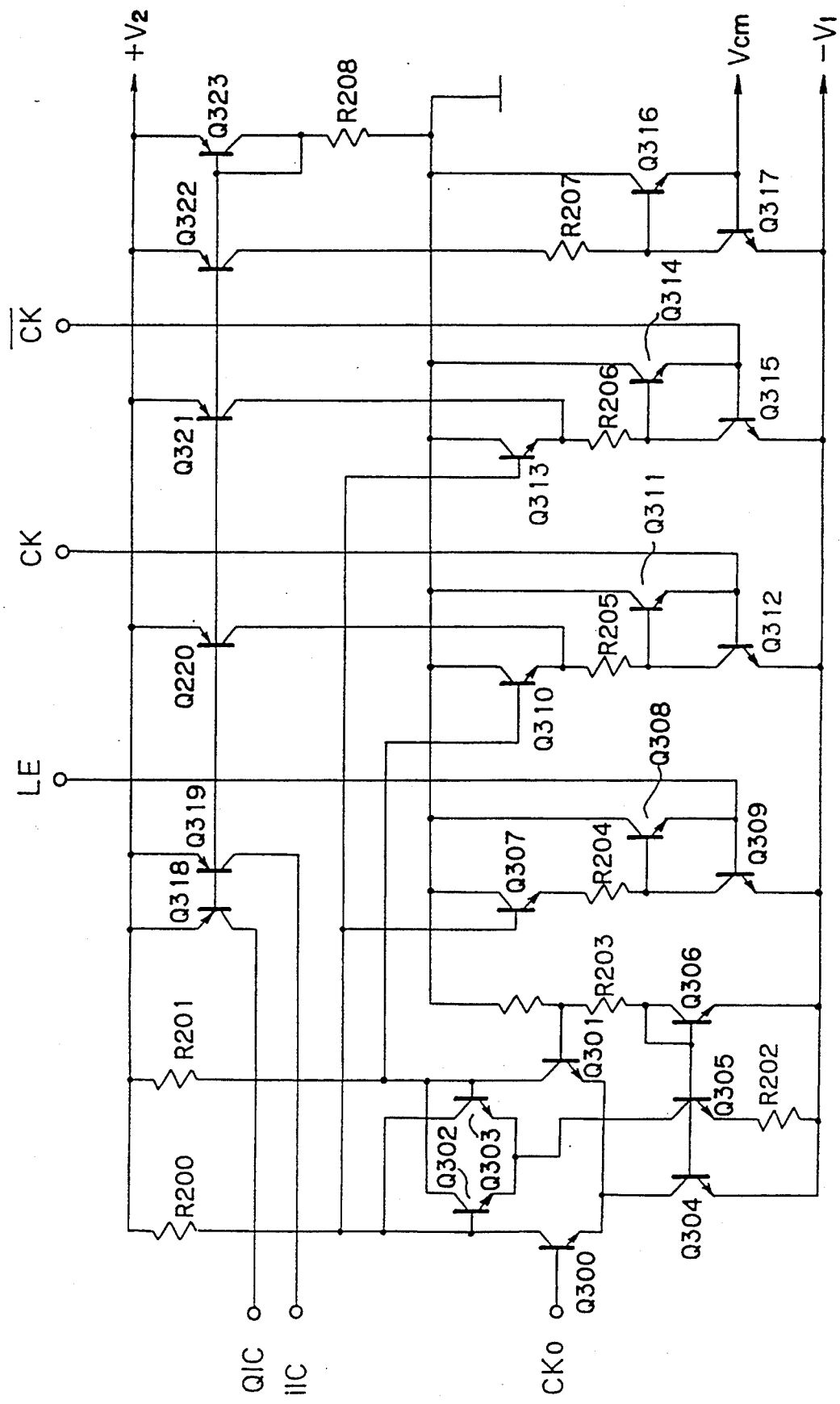
FIG. 26 is a circuit diagram of a circuit for generating currents, voltages and control signals used in the circuits shown in FIG. 14, FIG. 15, FIG. 21, FIG. 24 and FIG. 25.

FIG. 26 shows an example of a circuit for generating the current source iIc and QIc to use in the circuits shown in FIG. 14 and FIG. 15, the latch enable signal LE to use in the circuit shown in FIG. 21, CK and $\overline{CK}$ to use in the circuits shown in FIG. 24 and FIG. 25, and the constant voltage Vcm for the current mirror circuits used in the various circuits.

A circuit for generating the Vcm is constituted by Q323 and R208 which operate as a constant voltage source by being connected to $+V_2$, Q322 wherein the constant voltage is supplied to its base terminal to operate as a constant current source, and Q316 and Q317 which constitute a part; of a current mirror circuit to let currents flow in various circuits at the same level as a current flowing through R207. Therefore, the constant currents flowing in various circuits vary in response to a variation of $+V_2$. The voltage $+V_2$ is a reference voltage for converting a current signal to a voltage signal, for example, in R31 of FIG. 17. Therefore, even when the $+V_2$ varies, the constant voltage Vcm and the current signals in various circuits also vary in response to the variation, and the current metrics also vary, so that variations of values and linearity of converted voltage signal can be held to a low level.

The circuits for generating LE, CK, and $\overline{CK}$ have a similar construction except that Q307, Q310, and Q313 are interposed for switching, and commonly include the constant voltage circuit constituted by Q323 and R208. Accordingly, while the Q307, Q310, or Q313 conducts, LE, CK, or $\overline{CK}$ is supplied as a voltage varying in response to the variation of $+V_2$. The circuits which are supplied with iIc or QIc (FIG. 14 and FIG. 15) also have a similar construction.

Figure 27:
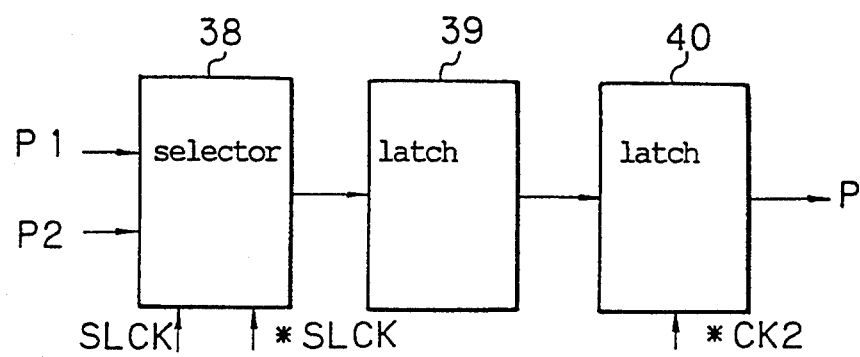
FIG. 27 is a block diagram showing a first example of a path memory cell in a path memory circuit.

FIG. 27 is a block diagram of a single path memory cell in a path memory circuit which is adapted to be connected to the ACS circuits shown in FIG. 18 as the following stage. The path memory circuit comprises $4(K+1)\cdot 2^{K-1}$ path memory cells having the above construction.

The path memory cell is constituted by a selector 38 that selects the output signal P1 or P2 from the path memory cell of the preceding stage in response to path select signals SLCK and *SLCK from the ACS circuits, and latch circuits 39 and 40. A signal having logic "1" or "0" is input to the path memory cell of the first stage as signal P1 or P2, and a connection between one stage and the following stage is determined by the generator polynomial.

Figure 28:
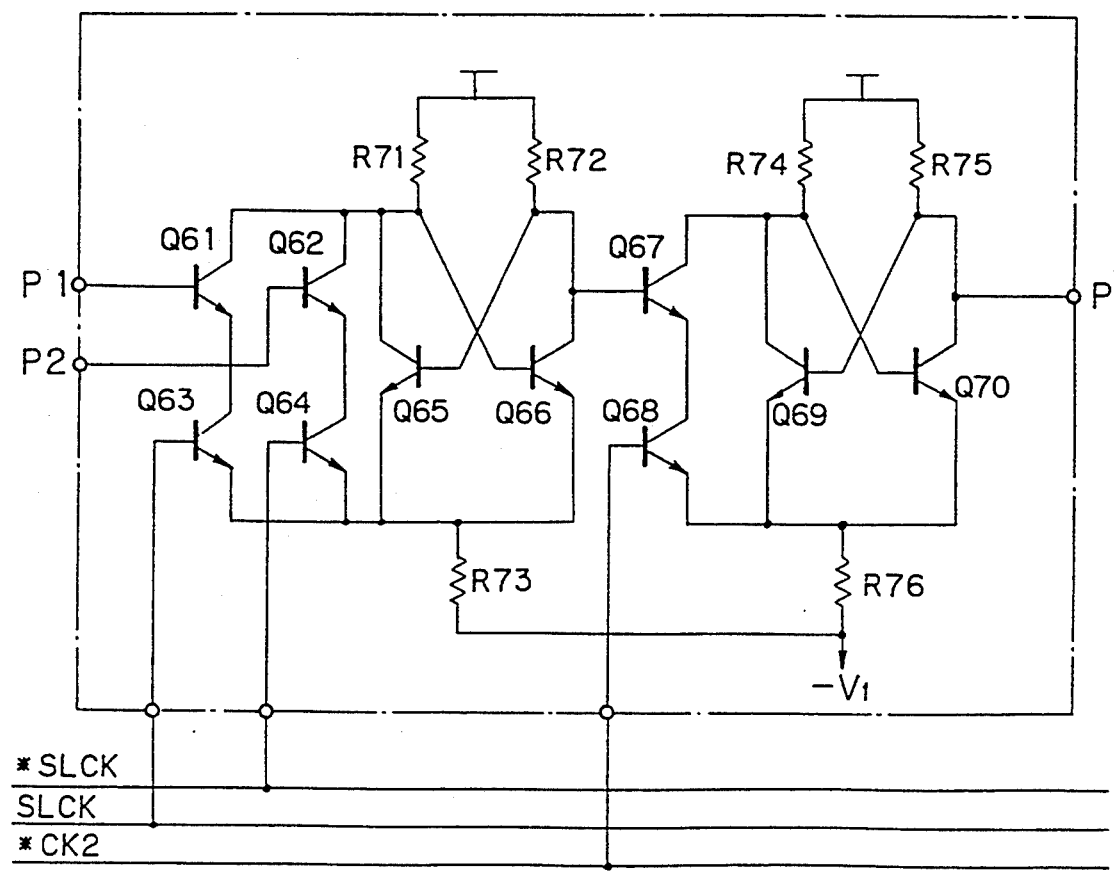
FIG. 28 is a circuit diagram showing a circuit construction of the path memory cell shown in FIG. 27.

FIG. 28 is a circuit diagram of the path memory cell of FIG. 27, and wherein the selector 38 is constituted by transistors Q61 to Q64, the latch circuit 39 is constituted by resistors R71 to R73 and transistors Q65 and Q66, and the latch circuit 40 is constituted by resistors R74 to R76 and transistors Q67 to Q70.

Figure 29:
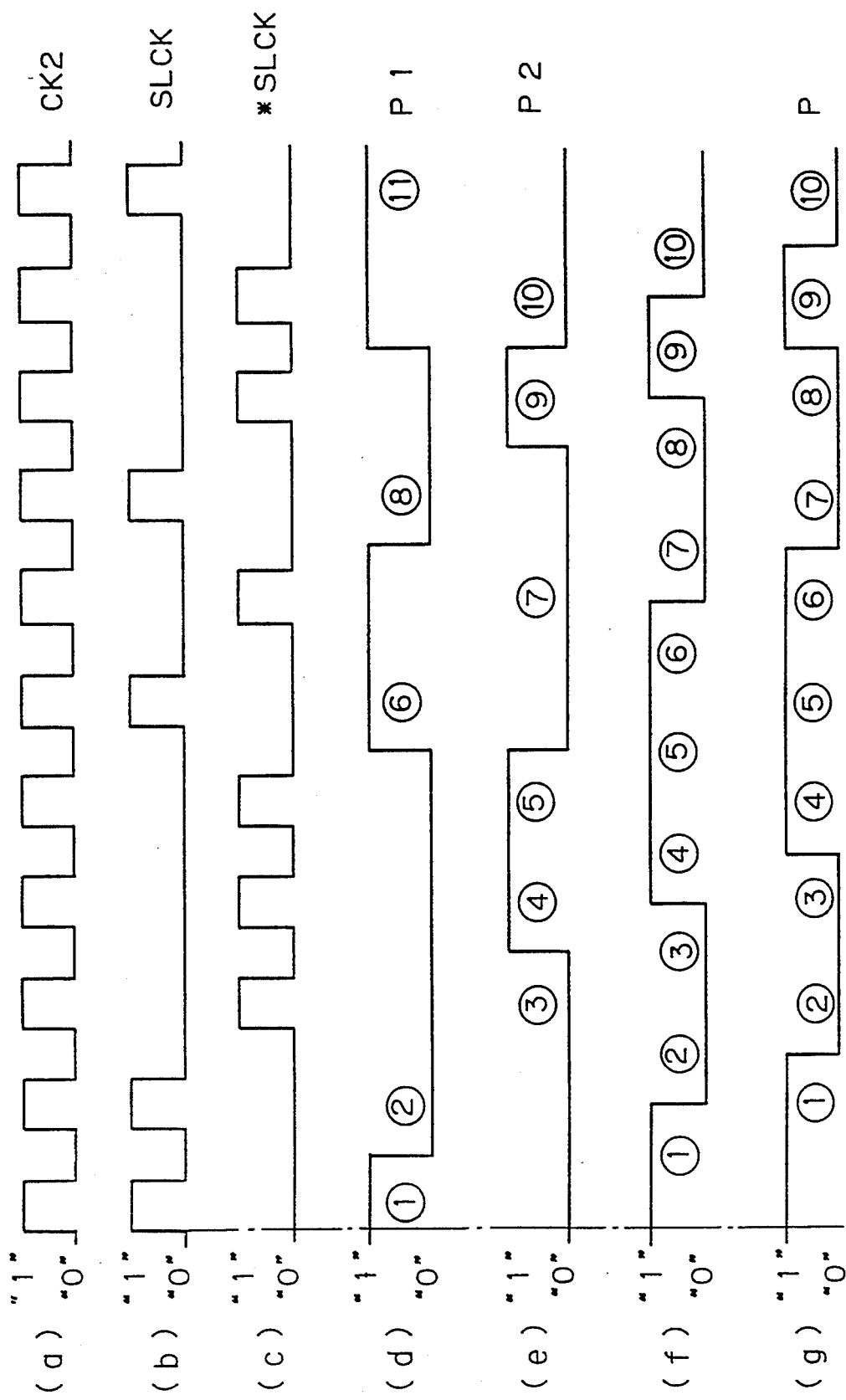
FIG. 29 is a timing chart for explaining an operation of the circuit shown in FIG. 28.

FIG. 29 is a diagram illustrating the operation of the above-mentioned path memory cell, wherein (a) shows clock signals CK2, (b) and (c) show path select signals SLCK and *SLCK, (d) and (e) show output signals P1 and P2 from the path memory cell of the preceding stage, (f) shows output signals of the latch circuit 39, and (g) shows output signals P of the latch circuit 40. The path select signals SLCK and *SLCK correspond to the signals in which the clock signals CK2 are masked. The signal P1 of the preceding stage is selected when the path select signal SLCK is "1", and the signal P2 of the preceding stage is selected when the path select signal *SLCK is "1". Accordingly, the portions denoted by ①  to 11 in the signals P1 and P2 of the diagrams (d) and (e) are selected and latched by the latch circuit 39 (transistors Q65, Q66), and the output signal becomes as shown in the diagram (f). Being latched by latch circuit 40 (transistors Q69, Q70), the output signals P become as shown in the diagram (g) and are added to the path memory cell of the next stage.

Figure 30:
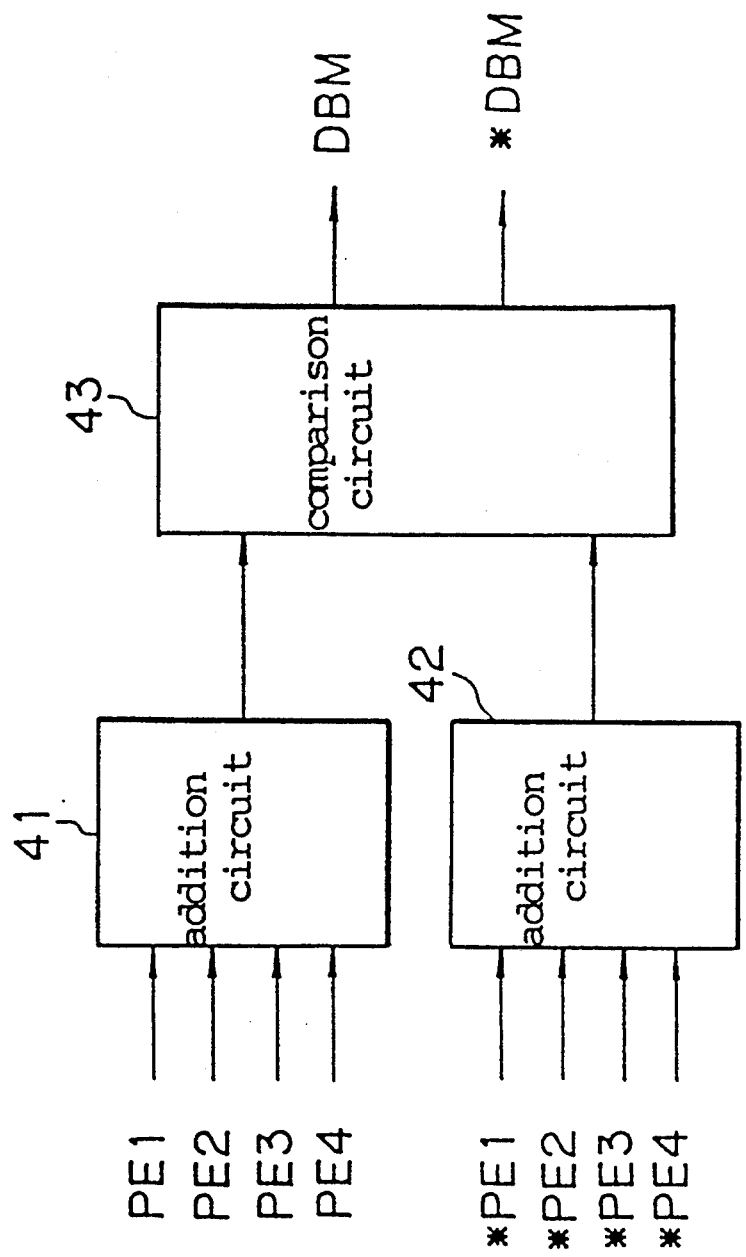
FIG. 30 is a block diagram showing a construction of a majority circuit.

FIG. 30 is a circuit diagram of a majority circuit for obtaining decoded output by using the output signal from the final stage of the path memory circuit.

Output signals PE1 to PE4 of the memory cells of the final stage and inverted output signals *PE1 to *PE4 are added to the adder circuits 41 and 42, and the added output signals are compared by a comparator circuit 43, and majority output signals DBM, *DBM are output as decoded output signals.

Figure 31:
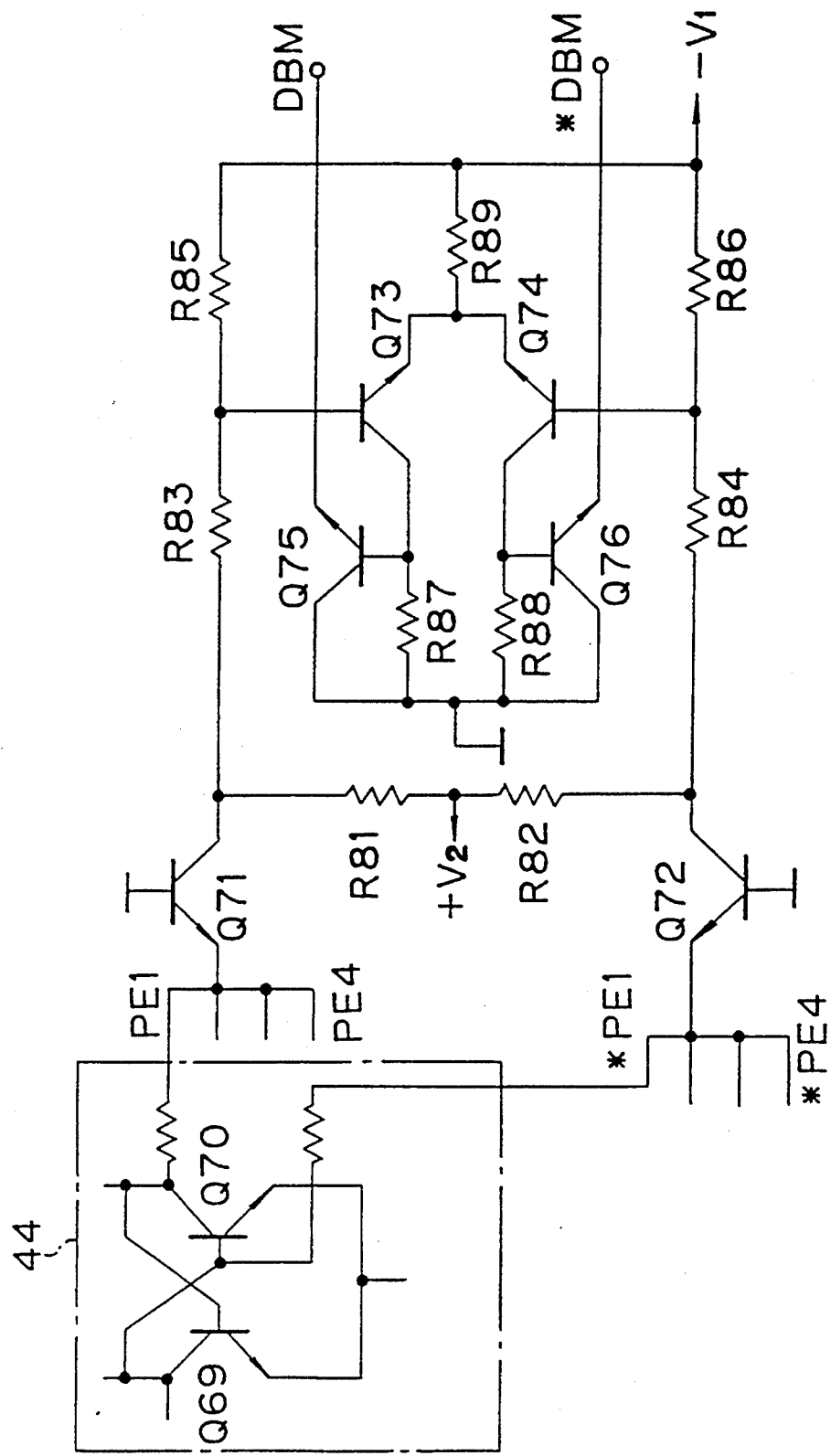
FIG. 31 is a circuit diagram showing a circuit construction of the majority circuit shown in FIG. 30.

FIG. 31 is a circuit diagram showing major portions in the majority circuit of FIG. 30, and wherein reference numeral 44 denotes a path memory cell in the final stage that includes transistors Q69 and Q70. The adder (or "addition") 41 is constituted by a transistor Q71, the adder (or "addition") 42 is constituted by a transistor Q72, and the comparator (or "comparison") 43 is constituted by transistors Q73 to Q76.

when the output signal PE1 of the path memory cell 44 of the final stage becomes "0" and other output signals PE2 to PE4 become "1", the complementary output signal *PE1 becomes "1" and the complementary output signal *PE2 to *PE4 become "0". In this case, a current flows from the transistor Q71 in response to the output signal PE1, and a current flows from the transistor Q72 in response to output signals PE2 to *PE4, the current flowing through the transistor Q72 being greater than the current flowing through the transistor Q71. These currents are converted into voltage by the resistors R81 and R82.

The levels are converted by resistors R83 to R86, and are compared in a differential amplifier consisting of transistors Q73 and Q74.

In this embodiment, the majority of the input signals are of an even number, and there may be a case where the signals "1" and "0" are input in the same number. In such a case, the S/N in the received signals will have been greatly deteriorated. Therefore, the decoded result is not affected irrespective of whether the determination is rendered to be "1" or "0". It is, however, also possible to make the resistance R81 and R82 different from each other, so that the determination is either "1" or "0" in such a case.

Figure 32:
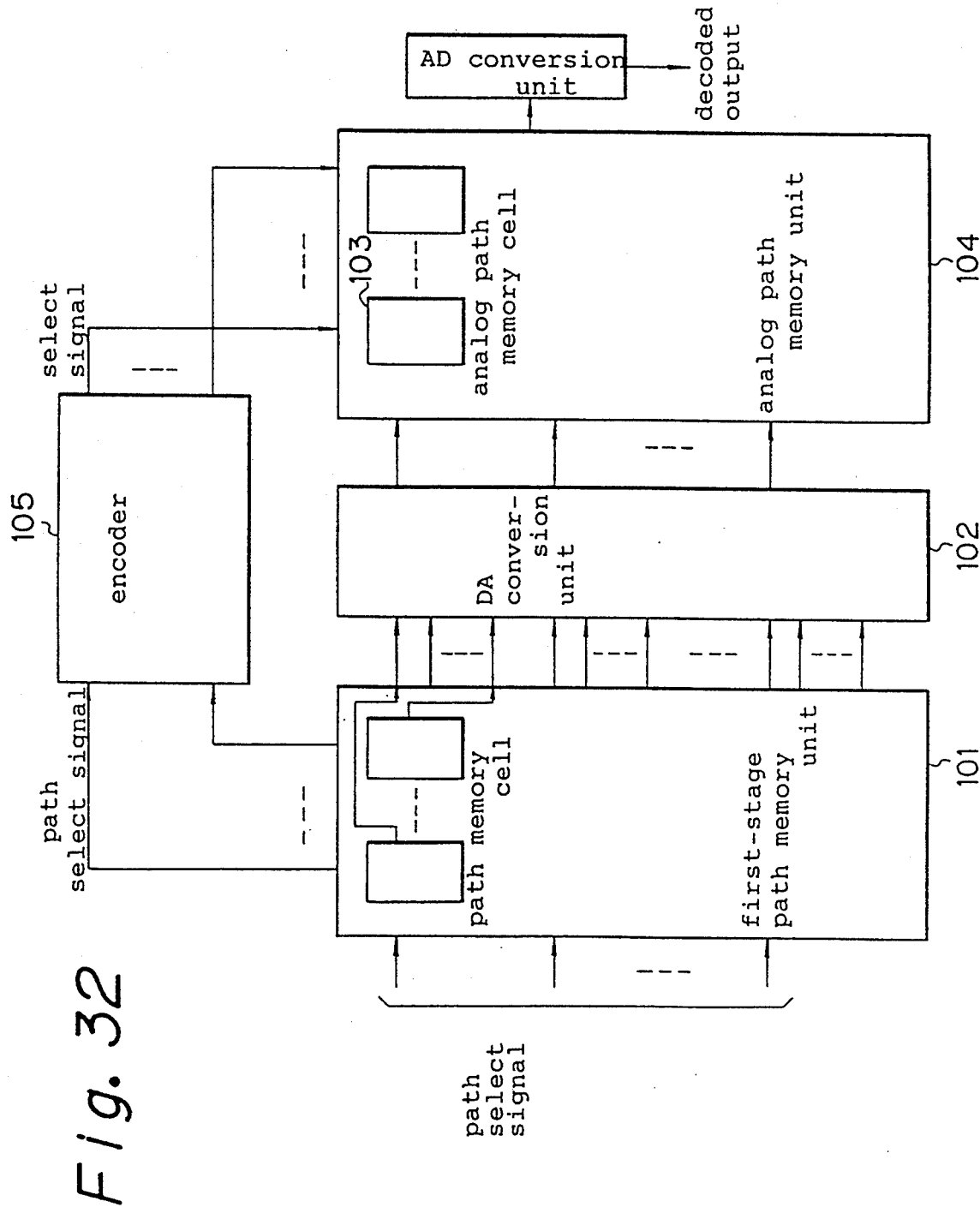
FIG. 32 is a block diagram showing another example of the path memory circuit.

FIG. 32 is a schematic block diagram showing another embodiment of the path memory circuits. These path memory circuits can be connected to the ACS circuit shown in either FIG. 17, FIG. 19, FIG. 20, or FIG. 21.

This path memory circuit is arranged so that a plurality of stages of the path memory cells can be realized by a single analog circuit.

The circuit comprises a first-stage path memory unit 101 having n stages of path memory cells that receive path select signals; a DA conversion unit 102 that converts output signals of n stages of the first-stage path memory unit 101 into $2^n$ values; an analog path memory unit 104 having a plurality of stages of analog path memory cells 103 to successively store output signals of $2^n$ values of the DA converter (or "conversion") unit 102; and an encoder 105 that supplies to the analog path memory unit 104 select signals corresponding to the path select signals for every n times of the path select signals, and a decoded output is obtained from an AD conversion unit.

Figure 33:
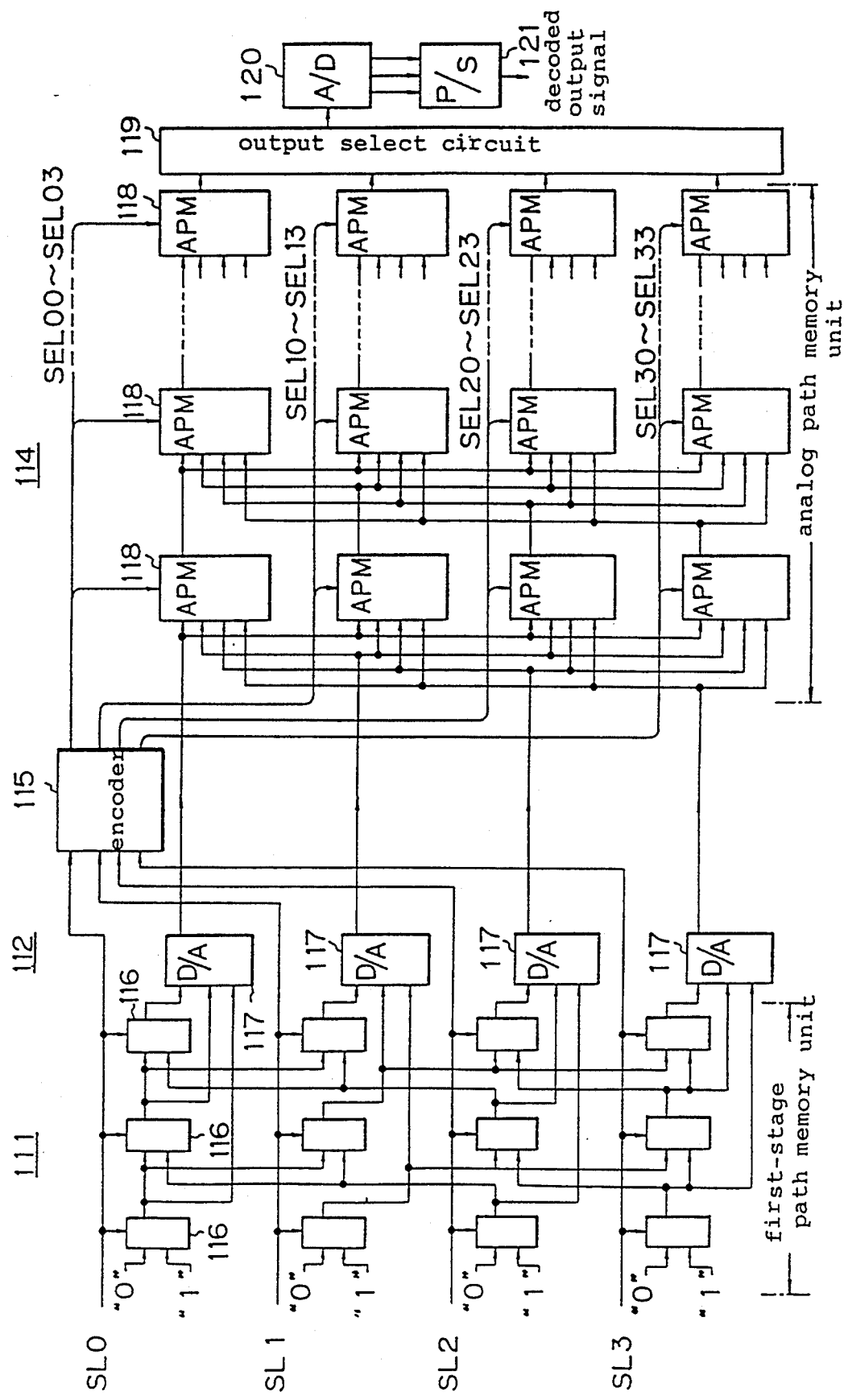
FIG. 33 is a more detailed block diagram of the path memory circuit shown in FIG. 32.

FIG. 33 is a block diagram of a concrete example of the path memory circuit shown in FIG. 32 for the case when the information rate of the folded code is $R = \frac{1}{2}$ and the constraint length is $K = 3$. In FIG. 33, reference numeral 111 denotes a first-stage path memory unit, 112 denotes a DA conversion unit, 114 denotes an analog path memory unit, 115 denotes an encoder, 116 denotes path memory cells, 117 denotes DA converters (D/A), 118 denotes analog path memory cells (APM), 119 denotes an output select circuit, 120 denotes an AD converter (A/D), and reference numeral 121 denotes a parallel/serial converter (P/S).

Path select signals SLO to SL3 from an ACS circuit (not shown) are applied to the first-stage path memory unit 111 and to the encoder 115. The first-stage path memory unit 111 is constituted by path memory cells 116 that are arranged in three stages, each path memory cell 116 being constituted by a one-bit memory of either a digital circuit or an analog circuit. "0" or "1" are successively shifted according to the path select signals, and output signals from each of the stages are applied to the DA converters 117 where they are converted into $2^n = 2^3 = 8$ (octal) and are applied to the analog path memory unit 114.

The analog path memory unit 114 is constituted by analog path memory cells 118 of a plurality of stages, where each analog path memory cell 118 corresponds to three stages of path memory cells and is capable of storing an octal signal. In response to a select signal from the encoder 115, the analog path memory unit 114 selects the output signal from the preceding stage and stores it. Therefore, the analog path memory unit 114 according to this embodiment has a number of stages which is one-third that of the prior art, making it possible to reduce the scale of the circuit.

Further, the output signals of the final stages of the analog path memory unit 114 are applied to the output select circuit 119 where a maximum value is selected out of the output signals and is converted into a digital signal through the AD converter 120. The digital signals output in parallel in three bits are converted by the parallel/serial converter 121 into serial signals which are used as decoded output signals.

Figure 34:
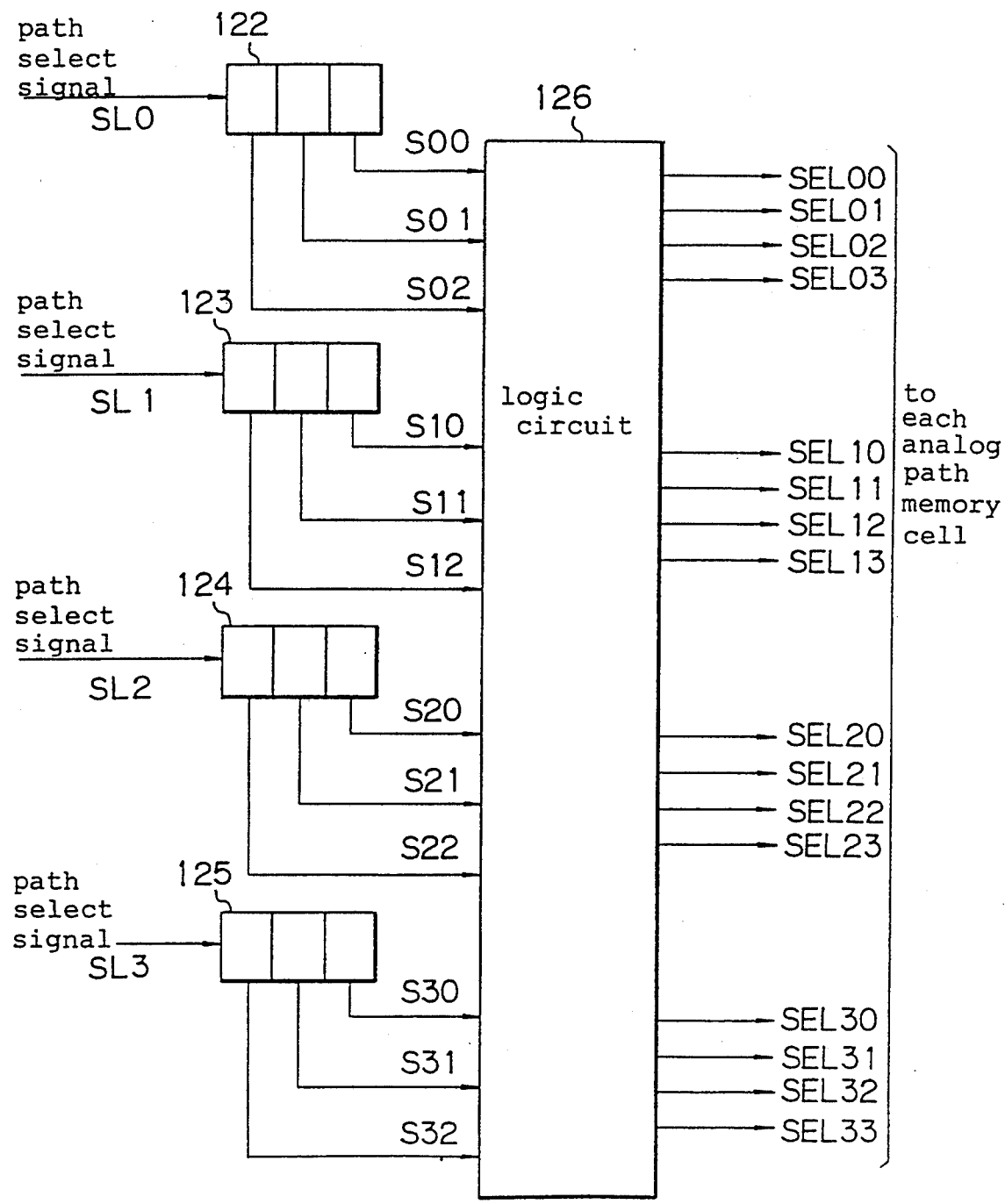
FIG. 34 is a circuit construction diagram of the encoder shown in FIG. 33.

The encoder 115 has a constitution shown, for example, in FIG. 34 wherein reference numerals 122 to 125 denote three-bit shift registers, and 126 denotes a logic circuit. The path select signals SLO to SL3 are applied to the shift registers 122 to 125 and are shifted, and the path select signals SLO to SL3 of three times are converted into path select signals S00 to S02, S10 to S12, S20 to S22 and S30 which are each S32 of parallel outputs of three bits and are simultaneously applied to the logic circuit 126. The logic circuit 126 is constituted by a gate circuit or a read-only memory, and outputs select signals SEL00 to SEL03, SEL10 to SEL13, SEL20 to SEL23, SEL30 to SEL33 that correspond to the path select signals S00 to S02, S10 to S12, S20 to S22, and sends them to the analog path memory unit 114.

FIG. 35 is a diagram for explaining the logic of the logic circuit 126 wherein, for example, the select signal SEL01 is obtained by a logical sum of a logical product of inverted signals of path select signals S20, S02 and path select signal S01, and a logical product of an inverted signal of path select signal S30, and path select signals S21 and S02.

Figure 36:
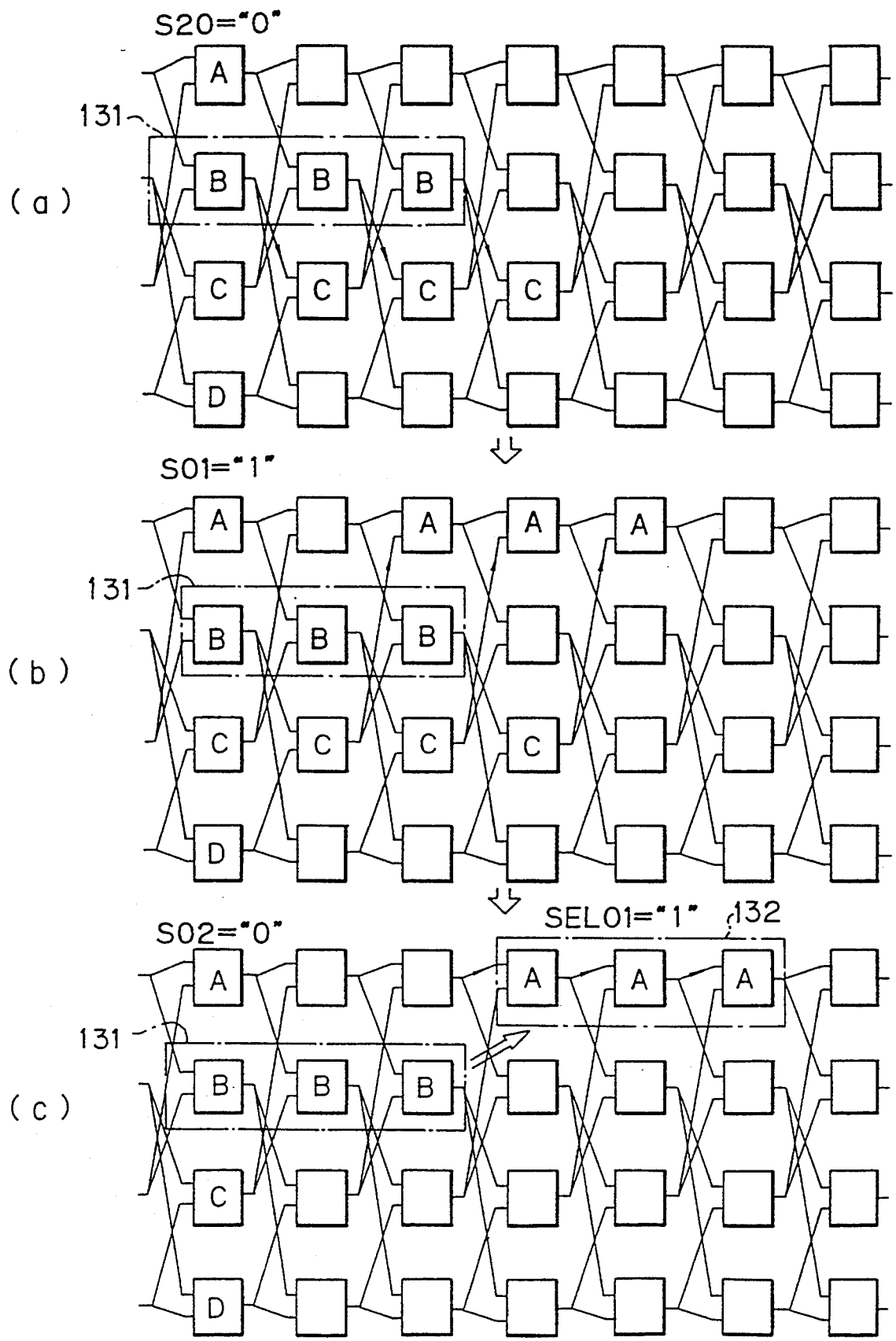
FIG. 36 is a diagram for explaining an operation of the path memory circuit shown in FIG. 33 to FIG. 35.

FIGS. 36(a) to 36(c) are explanatory diagrams related to the aforementioned select signal SEL01. It is now presumed that the path memory cell selects the upper side of input from the preceding stage when the path select signal is "0" and selects the lower side of input from the preceding stage when the path select signal is "1". Then, when the path select signal S20 corresponding to the path select signal SL2 at time to is "0", the path memory cell c among a series of path memory cells A, B, C and D selects and stores the signal output from the path memory cell B in the preceding stage. That is, shifting takes place as indicated by arrows in FIG. 36(a).

When the path select signal S01 corresponding to the path select signal SLO at a next time t1 is "1", the path memory cell A selects and stores the signal output from the path memory cell C in the preceding stage. That is, shifting takes place as indicated by arrows in FIG. 36(b).

When the path select signal S02 corresponding to the path select signal SLO at a next time t2 is "0", the path memory cell A selects and stores the signal output from the path memory cell A in the preceding stage. That is, shifting takes place as indicated by arrows in FIG. 36(c).

In the aforementioned operation, a portion 131 of three stages of path memory cells B surrounded by a dot-dash chain line is shifted into a portion 32 of three stages of path memory cells A surrounded by a dot-dash chain line by the path select signals S20 = "0", S01 = "1" and S02 = "0". The portion 131 is similarly shifted to the portion 132 even in the case of the path select signals S30 = "0", S21 = "1" and S02 = "1".

Therefore, the select signal SEL01 becomes, $$SEL01 = \overline{S20} \cdot S01 \cdot \overline{S02} + \overline{S30} \cdot S21 \cdot S02$$

as shown in FIG. 35. Here, the symbol "+" denotes the logical sum and "." denotes the logical product. The same also holds true for other select signals. That is, path memory cells of three stages are realized by a single analog path memory cell 118, and the shifting is carried out in the analog path memory unit 114 consisting of analog path memory cells 118 in response to the select signals SELij (i, j = 0, 1, 2, 3) that corresponding to path select signals of three times.

FIG. 37 is a diagram which illustrates the analog path memory cell according to the embodiment of the present invention that is constituted by a selector unit 141 and an analog memory unit 142. The selector unit 141 is constituted by switches 143 to 146 such as transistors that are controlled by the select signals SELx0 to SELx3 (x = 0, 1, 2, 3), and selects the output signal of the DA converter 117 or the output signal of the analog path memory cell 118 in the preceding stage, and inputs it to the analog memory unit 142. The analog memory unit 142 is constituted by capacitors C5 and C6, buffer amplifiers 148 and 149, and a switch 147 which consists of a transistor or the like and which is turned on or off by a clock signal that is not shown.

Therefore, four output signals having $2^3$ levels from the preceding state are selected by the select signals SELx0 to SELx3, applied to the capacitor C5 in the analog memory unit 142, transferred to the capacitor C6 via switch 147 that is turned on by a clock signal, and are sent as output signals from the capacitor C6 to the next stage via the buffer amplifier 149.

When the analog path memory cell 118 is capable of storing n bits, i.e., has the resolution of $2^n$ levels, the number of inputs m to the analog path memory cell 118 is either $2^{K-1}$ or $2^n$ whichever is smaller. In the above-mentioned embodiment, K=3 and $2^n$=8. Therefore, the relationship becomes $2^{K-1}<2^n$, and the number of inputs m becomes $2^{K-1}$=4.

Furthermore, when the select signal SELij turns on or off the switch in the selector unit 141 corresponding to the shifting from the node j to the node i, and when the switch is turned on by the signal SELij=1, then the select signal SELij can be found as described below using a path select signal input to the node i at a moment t as Sit.

First, the node number $i^{(1)}$ at a moment t−1 is found from the following equation.

$$i^{(1)} = [i/2] + 2^{K-2} \times Sit \ldots \quad (1)$$

where [x] such as [i/2] is a maximum integer that is not greater than x.

Furthermore, a path select signal $Si_{(1)}(t-1)$ input to the node $i^{(1)}$ is read at a moment t−1. Hereinafter in the same manner, a node number $i^{(h+1)}$ at a moment t-(h+1) is found from a path select signal $Si^{(h)}(t-h)$ at a node $i^{(h)}$ at a moment t-h in compliance with the following equation, $$i^{(h+1)} = [i^{(h)}/2] + 2^{K-2} \times Si^{(h)}(t-h) \ldots \quad (2)$$

Using the above asymptotic equation, the node number $i^{(n)}$ at a moment t-n is found. A logical product Sm1 that yields $i^{(n)}$=j is found out of the thus found sets of pulse select signals, i.e., $$Sm1 = Sit \cdot Si^{(1)}(t-1) \ldots \\ \cdot Si^{(i)}(t-l) \ldots \quad (3) \\ \cdot Si^{(n-1)}(t-(n-1))$$

Similarly, logical products Smg of all sets of path select signals that yield $i^{(n)}$=j are found, and a logical sum thereof is found to obtain SELij, i.e., $$SELij = Sm1 + Sm2 + \ldots + Smg \ldots \quad (4)$$

Here, the total number Nsmg of Smg that yield $i^{(n)}$=j is, $$Nsmg = \begin{bmatrix} 2^{n-k+1} & (n - K + 1 \geq 0) \\ 1 & (n - K + 1 < 0) \end{bmatrix}$$

As mentioned in the above embodiment, the coding factor is R=½, the locked length is K=3, and n=3. Therefore, the select signal SEL01 when i=0 and j=1 becomes as follows:

Here, since shifting takes place into the node i=0 at a moment t=2, $$1^{(1)} = [i/2] + 2^{K-2} \times Sit = 0 + 2 \times S02$$

and $i^{(1)}=0$ when S02=0.

Furthermore, $$i^{(2)} = [i^{(1)}/2]2^{K-2} \times Si^{(1)}(t-1) = 0 + 2 \times S01$$

and $i^{(2)}=2$ when S01=1.

Moreover, $$i^{(3)} = [i^{(2)}/2] + 2^{K-2}Si^{(2)}(t-2) = 1 + 2 \times S20$$

and $i^{(3)}=1$ when S20=0.

Therefore, one of the sets of path select signals that yield $i^{(3)}$=j=1 is,

[S02=0, S01=1, S20=0]

and $Sm1 = \overline{S02} \cdot S01 \cdot \overline{S20}$

Similarly, another one of the sets of path select signals that yield $i^{(3)}$=j=1 is,

[S02=1, S21=1, S30=0]

and hence, $Sm2 = S02 \cdot S21 \cdot \overline{S30}$

Further, since $Nsmg=2^{n-K+1}=2$, there exist two Smg that yield $i^{(3)}$=1, i.e., Sm1 and Sm2, and the logical sum thereof becomes the select signal SEL01 as indicated by an arrow in FIG. 35.

As described above, the logic of the encoder 115 is constituted by the gate circuit or by the read-only memory that reads the select signals SELij with the path select signals corresponding to a plurality of stages as addresses.

The aforementioned embodiment has chiefly dealt with the case where the coding factor was R=½, the constraint length was K=3, and the number of stages with n=3 in the first-stage path memory unit. However, the present invention is in no way limited thereto only but can be adapted to various cases depending on any coding factor R, constraint length K and resolution of the analog path memory cells. Moreover, the analog path memory cell may employ any constitution provided it is capable of storing the data of $2^n$ levels.

Furthermore, the branch metric calculation circuit 1 and/or the ACS circuit 2 described with reference to FIG. 7 to FIG. 26 may not only be combined with the path memory circuit 3 described with reference to FIG. 32 to FIG. 37, but may also be combined with a conventional digital circuit, for example, a path memory circuit constructed by ECL circuits. Conversely, a branch metric calculation circuit and ACS circuit constructed by digital circuits may be combined with the path memory circuit based on the analog signal process as described with reference to FIG. 32 to FIG. 37.

I claim:

1. An analog Viterbi decoder comprising:
   branch metric calculation means for successively calculating branch metrics from received symbols to output the branch metrics;
   adder, comparator and selector (ACS) means for successively calculating pairs of path metrics by adding preselected pairs of branch metrics and preselected pairs of last path metrics, respectively, for comparing the pairs of calculated path metrics with each other to select paths having smaller path metric values, and for outputting path selection signals to be used in said selections; and path memory means for successively storing candidates for a decoded signal according to said path selection signals and for successively refining the candidates according to said path selection signals to obtain the decoded signal, said branch metric calculation means outputting said branch metrics in analog signal form, said ACS means performing said adding, comparing, and outputting in analog signal processes, said branch metric calculation means including a current conversion circuit for converting values of said received symbols to current signals, and a first addition circuit coupled to the current conversion circuit, for calculating current branch metrics from said current signals, said received symbols are input to the analog Viterbi decoder in digital signal form including a plurality of bits, and said current conversion circuit comprises a plurality of digital/analog conversion circuits for converting said received symbols into current signals.

2. An analog Viterbi decoder as claimed in claim 1, wherein said digital/analog conversion circuits include $2^n$ (n=0, 1, 2 . . . ) parallel connected constant current sources and an output current of each of said $2^n$ parallel connected constant current sources is controlled according to said digital signal form of the received symbols, whereby non-inverted and inverted current signals are output.

3. An analog Viterbi decoder as claimed in claim 2, wherein said $2^n$ parallel connected constant current sources are controlled by external control signals.

4. An analog Viterbi decoder comprising:

branch metric calculation means for successively calculating branch metrics from received symbols to output the branch metrics;

adder, comparator and selector (ACS) means for successively calculating pairs of path metrics by adding preselected pairs of branch metrics and preselected pairs of last path metrics, respectively, for comparing the pairs of calculated path metrics with each other to select paths having smaller path metric values, and for outputting path selection signals to be used in said selections; and path memory means for successively storing candidates for a decoded signal according to said path selection signals and for successively refining the candidates according to said path selection signals to obtain the decoded signal, said branch metric calculation means outputting said branch metrics in analog signal form, said ACS means performing said adding, comparing, and outputting in analog signal processes, said branch metric calculation means including a current conversion circuit for convening values of said received symbols to current signals, and a first addition circuit coupled to the current conversion circuit, for calculating current branch metrics from said current signals, said first addition circuit including a plurality of addition circuit blocks each including a number of first common base type transistor circuits connected in parallel with each other, the first common base type transistor circuits generating respective current branch metrics which are equal to each other.

5. An analog Viterbi decoder as claimed in claim 4, wherein said ACS means includes a path metric memory for storing said path metrics in voltage signal form and for outputting current path metrics, a second addition circuit coupled to said path metric memory, for adding preselected pairs of said current branch metrics and preselected pairs of said current path metrics, respectively, to output pairs of new current path metrics;

a current/voltage conversion circuit coupled to said second addition circuit, for converting said current path metrics calculated in said second addition circuit to voltage path metrics, a comparison and selection circuit coupled to said current/voltage conversion circuit, for comparing pairs of said voltage path metrics with each other to select path metrics having smaller path metric values which are stored in said path metric memory, and to output said path selection signals, said second addition circuit including a plurality of second common base type transistor circuits each serially connected to one of the first common base type transistor circuits.

6. An analog Viterbi decoder comprising:

branch metric calculation means for successively calculating branch metrics from received symbols to output the branch metrics;

adder, comparator and selector (ACS) means for successively calculating pairs of path metrics by adding preselected pairs of branch metrics and preselected pairs of last path metrics, respectively, for comparing the pairs of calculated path metrics with each other to select paths having smaller path metric values, and for outputting path selection signals to be used in said selections; and path memory means for successively storing candidates for a decoded signal according to said path selection signals and for successively refining the candidates according to said path selection signals to obtain the decoded signal, said branch metric calculation means outputting said branch metrics in analog signal form, said ACS means performing said adding, comparing, and outputting in analog signal processes, said branch metric calculation means including a current conversion circuit for converting values of said received symbols to current signals, and a first addition circuit coupled to the current conversion circuit, for calculating current branch metrics from said current signals, said ACS means including a path metric memory for storing said path metrics in voltage signal form and for outputting current path metrics, a second addition circuit coupled to said path metric memory, for adding preselected pairs of said current branch metrics and preselected pairs of said current path metrics, respectively, to output pairs of new current path metrics;

a current/voltage conversion circuit coupled to said second addition circuit, for converting said current path metrics calculated in said second addition circuit to voltage path metrics, a comparison and selection circuit coupled to said current/voltage conversion circuit, for comparing pairs of said voltage path metrics with each other to select path metrics having smaller path metric values which are stored in said path metric memory, and to output said path selection signals;

said comparison and selection circuit including pairs of emitter follower circuits to which pairs of said voltage path metrics are input and whose emitter terminals are connected to each other so that path metrics having smaller values are selected to be output, and differential amplifier circuits coupled to the pairs of emitter follower circuits, to which pairs of said voltage path metrics are input so that said path selection signals are output.

7. An analog Viterbi decoder comprising:

branch metric calculation means for successively calculating branch metrics from received symbols to output the branch metrics;

adder, comparator and selector (ACS) means for successively calculating pairs of path metrics by adding preselected pairs of branch metrics and preselected pairs of last path metrics, respectively, for comparing the pairs of calculated path metrics with each other to select paths having smaller path metric values, and for outputting path selection signals to be used in said selections; and path memory means for successively storing candidates for a decoded signal according to said path selection signals and for successively refining the candidates according to said path selection signals to obtain the decoded signal, said branch metric calculation means outputting said branch metrics in analog signal form, said ACS means performing said adding, comparing, and outputting in analog signal processes, said branch metric calculation means including a current conversion circuit for converting values of said received symbols to current signals, and a first addition circuit coupled to the current conversion circuit, for calculating current branch metrics from said current signals, said ACS means including a path metric memory for storing said path metrics in voltage signal form and for outputting current path metrics, a second addition circuit coupled to said path metric memory, for adding preselected pairs of said current branch metrics and preselected pairs of said current path metrics, respectively, to output pairs of new current path metrics;

a current/voltage conversion circuit coupled to said second addition circuit, for converting said current path metrics calculated in said second addition circuit to voltage path metrics, a comparison and selection circuit coupled to said current/voltage conversion circuit, for comparing pairs of said voltage path metrics with each other to select path metrics having smaller path metric values which are stored in said path metric memory, and to output said path selection signals;

said path metric memory including two stages of sample-hold circuits.

8. An analog Viterbi decoder as claimed in claim 7, wherein said path metric memory includes a seesaw differential amplifier for level shifting and voltage/current conversion.

9. An analog Viterbi decoder comprising:

branch metric calculation means for successively calculating branch metrics from received symbols to output the branch metrics;

adder, comparator and selector (ACS) means for successively calculating pairs of path metrics by adding preselected pairs of branch metrics and preselected pairs of last path metrics, respectively, for comparing the pairs of calculated path metrics with each other to select paths having smaller path metric values, and for outputting path selection signals to be used in said selections; and path memory means for successively storing candidates for a decoded signal according to said path selection signals and for successively refining the candidates according to said path selection signals to obtain the decoded signal, said branch metric calculation means outputting said branch metrics in analog signal form, said ACS means performing said adding, comparing, and outputting in analog signal processes, said branch metric calculation means including a current conversion circuit for converting values of said received symbols to current signals, and a first addition circuit coupled to the current conversion circuit, for calculating current branch metrics from said current signals, said ACS means including a path metric memory for storing said path metrics in voltage signal form and for outputting current path metrics, a second addition circuit coupled to said path metric memory, for adding preselected pairs of said current branch metrics and preselected pairs of said current path metrics, respectively, to output pairs of new current path metrics;

a current/voltage conversion circuit coupled to said second addition circuit, for converting said current path metrics calculated in said second addition circuit to voltage path metrics, a comparison and selection circuit coupled to said current/voltage conversion circuit, for comparing pairs of said voltage path metrics with each other to select path metrics having smaller path metric values which are stored in said path metric memory, and to output said path selection signals, said ACS means including a normalization circuit coupled to said path metric memory, for outputting a normalization voltage for normalizing all path metrics stored in said path metric memory, by comparing all the path metrics with each other and by selecting the smallest path metrics.

10. An analog Viterbi decoder as claimed in claim 9, wherein said normalization circuit includes a plurality of transistors having base terminals connected to be respective path metrics and having emitter terminals connected with each other to output the smallest path metric.

11. An analog Viterbi decoder as claimed in claim 9, wherein said normalization circuit includes two-stages of sample-hold circuits and said normalization voltage is supplied to the output of the second stage of said sample-hold circuits in said path metric memory.

12. An analog Viterbi decoder as claimed in claim 11, wherein said normalization voltage is supplied to an input of the first stage of said sample-hold circuit in said path metric memory.

13. An analog Viterbi decoder comprising:
branch metric calculation means for successively calculating branch metrics from received symbols to output the branch metrics;
adder, comparator and selector (ACS) means for successively calculating pairs of path metrics by adding preselected pairs of branch metrics and preselected pairs of last path metrics, respectively, for comparing the pairs of calculated path metrics with each other to select paths having smaller path metric values, and for outputting path selection signals to be used in said selections; and
path memory means for successively storing candidates for a decoded signal according to said path selection signals and for successively refining the candidates according to said path selection signals to obtain the decoded signal,
said branch metric calculation means outputting said branch metrics in analog signal form,
said ACS means performing said adding, comparing, and outputting in analog signal processes,
said branch metric calculation means including
a current conversion circuit for converting values of said received symbols to current signals, and
a first addition circuit coupled to the current conversion circuit, for calculating current branch metrics from said current signals; and
a common current mirror circuit including at least one constant current source, coupled to at least one of said branch metric calculation means, said ACS means and said path memory means, for supplying at least one current to at least one of said branch metric calculation means, said ACS means and said path memory means for use in calculating the decoded signal,
said current mirror circuit being coupled to a power source, and
at least one constant current of said current mirror circuit varying in response to a voltage variation of the power source.

14. An analog Viterbi decoder supplied with received symbols, comprising:
branch metric calculation means for successively calculating branch metrics from received symbols to output the branch metrics;
adder, comparator and selector (ACS) means for successively calculating pairs of path metrics by adding preselected pairs of branch metrics and preselected pairs of last path metrics, respectively, for comparing the pairs of calculated path metrics with each other to select paths having smaller path metric values, and for outputting path selection signals to be used in said selections; and
path memory means for successively storing candidates for a decoded signal according to said path selection signals and for successively refining the candidates according to said path selection signals to obtain a decoded signal,
said path memory means including
a first stage path memory part having n-stages of path memory cells for receiving said path selection signals, and for providing n-bit output signals;
a digital/analog conversion part coupled to the first stage path memory part, for converting the n-bit output signals from said n-stages of path memory cells to analog signals,
an analog path memory part coupled to the digital/analog conversion unit and having a plurality of stages of analog path memory cells, for sequentially storing said analog signals, and
an encoder coupled to the first-stage path memory part and the analog path memory part, for supplying selection signals corresponding to said path selection signals to said analog path memory part every time n path selection signals are input.

* * * * *

UNITED STATES PATENT AND TRADEMARK OFFICE
CERTIFICATE OF CORRECTION

PATENT NO. : 5,448,583
DATED : Sep. 5, 1995
INVENTOR(S) : MIYAMOTO et al.

It is certified that error appears in the above-indentified patent and that said Letters Patent is hereby corrected as shown below:

Col. 2, line 15, change "ACS" to --adder, comparator and selector (ACS)--;
line 47, after "metric" insert --calculation circuit;--;
line 52, change "the/-" to --the--;
line 57, after "branch" delete ",";
line 62, delete "diagram".

Col. 3, line 1, change "circuit-" to --circuit,--;
line 2, change "/and" to --and--.

Col. 4, line 28, change "structions" to --struction--.

Col. 5, line 4, change "$\bar{I}+Q$" to --$\bar{I}+\bar{Q}$--;
line 14, after "(or "conversion")" insert --circuit 12--.

Col. 6, line 15, after "°C." insert --,--.

Col. 7, line 30, change "$\bar{I}+Q$" (first occurrence) to --$\bar{I}+\bar{Q}$--.

Col. 8, line 48, delete "cope".

Col. 9, line 28, delete "and" (first occurrence).

Col. 10, line 53, begin a new paragraph with "FIG. 22".

Col. 12, line 20, after "another" delete ",".

Col. 13, line 13, after "part" delete ";".

UNITED STATES PATENT AND TRADEMARK OFFICE
CERTIFICATE OF CORRECTION

PATENT NO. : 5,448,583
DATED : Sep. 5, 1995
INVENTOR(S) : MIYAMOTO et al.

It is certified that error appears in the above-indentified patent and that said Letters Patent is hereby corrected as shown below:

Col. 14, line 24, change "when" to --When--;
line 47, change "resistance" to --resistances--.

Col. 15, line 54, change "S30 which are each S32 of" to --S30 to S32 which are each--.

Col. 16, line 35, change to read --$SEL01 = \overline{S20} \cdot S01 \cdot \overline{S02} + \overline{S30} \cdot S21 \cdot S02$--.

Col. 17, line 20, change "$Si_{(1)}(t-1)$" to --$Si^{(1)}(t-1)$--.

Signed and Sealed this

Twenty-sixth Day of December, 1995

Attest:

BRUCE LEHMAN

Attesting Officer     Commissioner of Patents and Trademarks